(12) United States Patent
Moon et al.

(10) Patent No.: US 12,148,639 B2
(45) Date of Patent: Nov. 19, 2024

(54) CORRECTING TARGET LOCATIONS FOR TEMPERATURE IN SEMICONDUCTOR APPLICATIONS

(71) Applicant: KLA Corporation, Milpitas, CA (US)

(72) Inventors: Min-Yeong Moon, Ann Arbor, MI (US); Phalguna Kumar Rachinayani, Milpitas, CA (US); Jean-Christophe Perrin, Oakland, CA (US); Stilian Pandev, Santa Clara, CA (US)

(73) Assignee: KLA Corp., Milpitas, CA (US)

( * ) Notice: Subject to any disclaimer, the term of this patent is extended or adjusted under 35 U.S.C. 154(b) by 117 days.

(21) Appl. No.: 17/959,008

(22) Filed: Oct. 3, 2022

(65) Prior Publication Data

US 2024/0120221 A1 Apr. 11, 2024

(51) Int. Cl.
*H01L 21/67* (2006.01)
*H01L 21/66* (2006.01)

(52) U.S. Cl.
CPC ........ *H01L 21/67248* (2013.01); *H01L 22/12* (2013.01)

(58) Field of Classification Search
CPC ......... H01L 21/67242; H01L 21/67248; H01L 21/67259; H01L 21/67098; H01L 21/67103; H01L 21/67109; H01L 21/67115; H01L 22/00; H01L 22/10; H01L 22/12; H01L 22/14; B23K 26/03; B23K 26/032; B23K 26/034
USPC ...................................................... 219/444.1
See application file for complete search history.

(56) References Cited

U.S. PATENT DOCUMENTS

| | | |
|---|---|---|
| 4,999,014 A | 3/1991 | Gold et al. |
| 5,181,080 A | 1/1993 | Fanton et al. |
| 5,608,526 A | 3/1997 | Piwonka-Corle et al. |
| 5,859,424 A | 1/1999 | Norton et al. |
| 5,877,859 A | 3/1999 | Aspnes et al. |
| 6,429,943 B1 | 8/2002 | Opsal et al. |

(Continued)

FOREIGN PATENT DOCUMENTS

| | | |
|---|---|---|
| KR | 10-2019-0072569 | 6/2019 |
| WO | 2017-123561 | 2/2017 |

OTHER PUBLICATIONS

International Search Report and Written Opinion for PCT/US2023/034061 mailed Feb. 6, 2024.

(Continued)

*Primary Examiner* — Sang Y Paik
(74) *Attorney, Agent, or Firm* — Ann Marie Mewherter

(57) ABSTRACT

Methods and systems for determining information for a specimen are provided. One system includes an output acquisition subsystem configured to generate output for a specimen at one or more target locations on the specimen and one or more temperature sensors configured to measure one or more temperatures within the system. The system also includes a deep learning model configured for predicting error in at least one of the one or more target locations based on at least one of the one or more measured temperatures input to the deep learning model by the computer subsystem. The computer subsystem is configured for determining a corrected target location for the at least one of the one or more target locations by applying the predicted error to the at least one of the one or more target locations.

24 Claims, 5 Drawing Sheets

(56) References Cited

U.S. PATENT DOCUMENTS

| | | |
|---|---|---|
| 6,515,746 B2 | 2/2003 | Opsal et al. |
| 7,478,019 B2 | 1/2009 | Zangooie et al. |
| 7,933,026 B2 | 4/2011 | Opsal et al. |
| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 9,291,554 B2 | 3/2016 | Kuznetsov et al. |
| 9,816,939 B2 | 11/2017 | Duffy et al. |
| 9,915,522 B1 | 3/2018 | Jiang et al. |
| 10,591,406 B2 | 3/2020 | Bringoltz et al. |
| 10,769,320 B2 | 9/2020 | Kuznetsov et al. |
| 2015/0235108 A1* | 8/2015 | Pandev .............. G01N 21/9501 382/149 |
| 2016/0104600 A1 | 4/2016 | Luo et al. |
| 2017/0109646 A1* | 4/2017 | David ................. G03F 7/70625 |
| 2017/0352140 A1 | 12/2017 | Isomura |
| 2018/0107928 A1 | 4/2018 | Zhang et al. |
| 2021/0263427 A1* | 8/2021 | Li ....................... G03F 7/70633 |
| 2022/0028713 A1 | 1/2022 | Ummethala et al. |
| 2023/0076545 A1* | 3/2023 | Kim ..................... G06F 11/106 |

OTHER PUBLICATIONS

Hand et al., "Principles of Data Mining (Adaptive Computation and Machine Learning)," MIT Press, Aug. 1, 2001, 578 pages.
Jebara, "Discriminative, Generative, and Imitative Learning," MIT Thesis, Feb. 2002, 212 pages.
Sugiyama, "Introduction to Statistical Machine Learning," Morgan Kaufmann, Oct. 9, 2015, 534 pages.

* cited by examiner

CORRECTING TARGET LOCATIONS FOR TEMPERATURE IN SEMICONDUCTOR APPLICATIONS

BACKGROUND OF THE INVENTION

1. Field of the Invention

The present invention generally relates to methods and systems for determining information for a specimen. Certain embodiments relate to correcting target locations on a specimen for temperature in a system that performs a process on the specimen.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on specimens to drive higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on specimens where defects have been detected by inspection. The higher resolution data for the defects generated by defect review is more suitable for determining attributes of to the defects such as profile, roughness, more accurate size information, etc. Defects can generally be more accurately classified into defect types based on information determined by defect review compared to inspection.

Metrology processes are also used at various steps during a semiconductor manufacturing process to monitor and control the process. Metrology processes are different than inspection processes in that, unlike inspection processes in which defects are detected on a specimen, metrology processes are used to measure one or more characteristics of the specimen that cannot be determined using currently used inspection tools. For example, metrology processes are used to measure one or more characteristics of a specimen such as a dimension (e.g., line width, thickness, etc.) of features formed on the specimen during a process such that the performance of the process can be determined from the one or more characteristics. In addition, if the one or more characteristics of the specimen are unacceptable (e.g., out of a predetermined range for the characteristic(s)), the measurements of the one or more characteristics of the specimen may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a specimen may be independent of the results of an inspection process performed on the specimen. In particular, the locations at which a metrology process is performed may be selected independently of inspection results. In addition, since locations on the specimen at which metrology is performed may be selected independently of inspection results, unlike defect review in which the locations on the specimen at which defect review is to be performed cannot be determined until the inspection results for the specimen are generated and available for use, the locations at which the metrology process is performed may be determined before an inspection process has been performed on the specimen.

One aspect of the methods and systems described above that can be difficult is knowing where on a specimen a result, e.g., a measurement, a detected defect, a re-detected defect, etc., is generated. For example, the tools and processes described above are used to determine information about structures and/or defects on the specimen. Since the structures vary across the specimen (so that they can form a functional device on the specimen), a measurement, inspection, or defect review result is generally useless unless it is known precisely where on the specimen it was generated. In a metrology example, unless a measurement is performed at a known, predetermined location on the specimen, the measurement may fail if the measurement location does not contain the portion of the specimen intended to be measured and/or the measurement of one portion of the specimen is assigned to another portion of the specimen. In the case of inspection, unless a defect location on the specimen is determined substantially accurately, the defect location may be inaccurately determined with respect to the specimen and/or the design for the specimen. In any case, errors in the locations on the specimen at which results were generated can render the results useless and can even be detrimental to a fabrication process if the results are used to make changes to the fabrication process.

A specimen may be aligned with respect to a tool before the specimen is scanned or measured using known alignment target(s) or mark(s) on the specimen. Based on information about the specimen, e.g., where patterns are formed on the specimen and/or where the intended targets are on the specimen, the tool can then perform measurements or scanning of the intended targets on the specimen. Even if alignment prior to measurement or scanning is successful, there are several factors that can cause reported locations in the results to be inaccurate. Therefore, many processes that involve navigating across a specimen include measuring and correcting position error during runtime. In some such instances, the scanning subsystem of the tool, which may include a robot and any other associated hardware, may move a specimen to a location and then the tool may perform alignment on a site-by-site basis.

There are, however, several disadvantages to such site-by-site alignment methods. For example, such methods are generally substantially slow. Site-by-site alignment also requires more images to be recorded, and image processing to be performed when performing alignment. In addition, site-by-site alignment methods do not take into account temperature-induced position errors on the tool.

Accordingly, it would be advantageous to develop systems and methods for determining information for a specimen that do not have one or more of the disadvantages described above.

SUMMARY OF THE INVENTION

The following description of various embodiments is not to be construed in any way as limiting the subject matter of the appended claims.

One embodiment relates to a system configured to determine information for a specimen. The system includes an output acquisition subsystem configured to generate output for a specimen at one or more target locations on the specimen and one or more temperature sensors configured to measure one or more temperatures within the system. The system also includes a computer subsystem configured to acquire the one or more measured temperatures from the one or more temperature sensors and one or more components executed by the computer subsystem. The one or more components include a deep learning (DL) model configured for predicting error in at least one of the one or more target locations based on at least one of the one or more measured temperatures input to the DL model by the computer subsystem. The computer subsystem is configured for determining a corrected target location for the at least one of the one or more target locations by applying the predicted error to the at least one of the one or more target locations. The system may be further configured as described herein.

Another embodiment relates to a method for determining information for a specimen. The method includes measuring one or more temperatures within a system with one or more temperature sensors. The system includes an output acquisition subsystem configured for generating output for a specimen at one or more target locations on the specimen. The method also includes predicting error in at least one of the one or more target locations by inputting at least one of the one or more measured temperatures into a DL model included in one or more components executed by a computer system. In addition, the method includes determining a corrected target location for the at least one of the one or more target locations by applying the predicted error to the at least one of the one or more target locations. The inputting and determining are performed by the computer system.

Each of the steps of the method may be performed as described further herein. The method may include any other step(s) of any other method(s) described herein. The method may be performed by any of the systems described herein.

Another embodiment relates to a non-transitory computer-readable medium storing program instructions executable on a computer system for performing a computer-implemented method for determining information for a specimen. The computer-implemented method includes acquiring one or more temperatures measured within a system with one or more temperature sensors. The system is configured as described above, and the computer-implemented method includes the predicting and determining steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
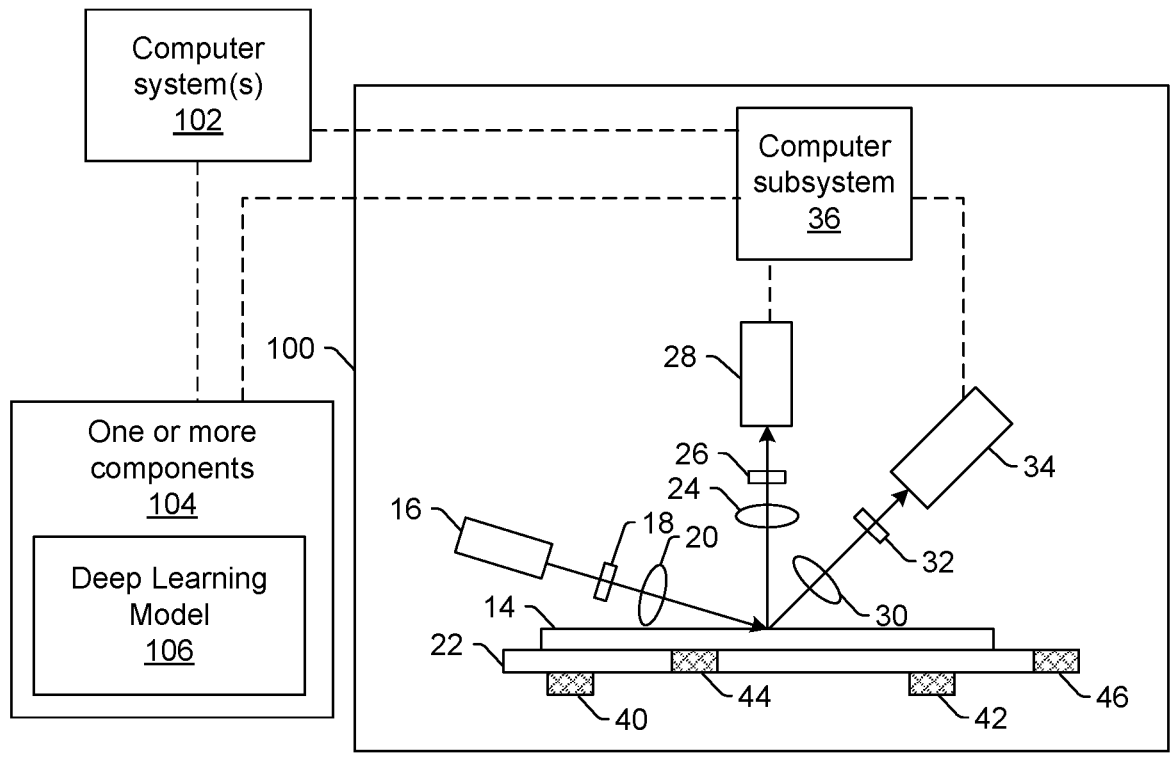
FIGS. 1-3 are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are systems and methods for determining information for a specimen. The information determined by the embodiments described herein includes position correction estimation for applications such as metrology and inspection. The embodiments can be advantageously used for generating position correction information to improve the accuracy of specimen placement in equipment such as metrology and inspection tools. In addition, the embodiments described herein advantageously use the machine learning (ML) domain for estimating the position corrections.

In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, personal computer (PC) boards, and other semiconductor specimens.

One embodiment of a system configured for determining information for a specimen is shown in FIG. 1. The system includes output acquisition subsystem 100. The output acquisition subsystem includes and/or is coupled to a computer subsystem, e.g., computer subsystem 36 and/or one or more computer systems 102.

In general, the output acquisition subsystems described herein include at least an energy source, a detector, and a scanning subsystem. The energy source is configured to generate energy that is directed to a specimen by the output acquisition subsystem. The detector is configured to detect energy from the specimen and to generate output responsive to the detected energy. The scanning subsystem is configured to change a position on the specimen to which the energy is directed and from which the energy is detected. In one embodiment, as shown in FIG. 1, the output acquisition subsystem is configured as a light-based output acquisition subsystem.

In the light-based output acquisition subsystems described herein, the energy directed to the specimen includes light, and the energy detected from the specimen includes light. For example, in the embodiment of the system shown in FIG. 1, the output acquisition subsystem includes an illumination subsystem configured to direct light to specimen 14. The illumination subsystem includes at least one light source. For example, as shown in FIG. 1, the illumination subsystem includes light source 16. The illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen and the process being performed on the specimen.

The illumination subsystem may be configured to direct the light to the specimen at different angles of incidence at different times. For example, the output acquisition subsystem may be configured to alter one or more characteristics of one or more elements of the illumination subsystem such that the light can be directed to the specimen at an angle of incidence that is different than that shown in FIG. 1. In one such example, the output acquisition subsystem may be configured to move light source 16, optical element 18, and lens 20 such that the light is directed to the specimen at a different oblique angle of incidence or a normal (or near normal) angle of incidence.

In some instances, the output acquisition subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, optical element 18 may be configured as a spectral filter and the properties of the spectral filter can be changed in a variety of different ways (e.g., by swapping out one spectral filter with another) such that different wavelengths of light can be directed to the specimen at different times. The illumination subsystem may have any other suitable configuration known in the art for directing light having different or the same characteristics to the specimen at different or the same angles of incidence sequentially or simultaneously.

Light source 16 may include a broadband plasma (BBP) light source. In this manner, the light generated by the light source and directed to the specimen may include broadband light. However, the light source may include any other suitable light source such as any suitable laser known in the art configured to generate light at any suitable wavelength (s). The laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for generating output.

The output acquisition subsystem may also include a scanning subsystem configured to change the position on the specimen to which the light is directed and from which the light is detected and possibly to cause the light to be scanned over the specimen. For example, the output acquisition subsystem may include stage 22 on which specimen 14 is disposed during output generation. The scanning subsystem may include any suitable mechanical and/or robotic assembly (that includes stage 22) that can be configured to move the specimen such that the light can be directed to and detected from different positions on the specimen. In addition, or alternatively, the output acquisition subsystem may be configured such that one or more optical elements of the output acquisition subsystem perform some scanning of the light over the specimen such that the light can be directed to and detected from different positions on the specimen. In instances in which the light is scanned over the specimen, the light may be scanned over the specimen in any suitable fashion such as in a serpentine-like path or in a spiral path.

The output acquisition subsystem further includes one or more detection channels. At least one of the detection channel(s) includes a detector configured to detect light from the specimen due to illumination of the specimen by the output acquisition subsystem and to generate output responsive to the detected light. For example, the output acquisition subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the output acquisition subsystem that includes two detection channels, the output acquisition subsystem may include a different number of detection channels (e.g., only one detection channel or two or more detection channels). In one such instance, the detection channel formed by collector 30, element 32, and detector 34 may form one side channel as described above, and the output acquisition subsystem may include an additional detection channel (not shown) formed as another side channel that is positioned on the opposite side of the plane of incidence. Therefore, the output acquisition subsystem may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the output acquisition subsystem may also include two or more side channels configured as described above. As such, the output acquisition subsystem may include at least three channels (i.e., one top channel and two side channels), and each of the at least three channels has its own collector, each of which is configured to collect light at different scattering angles than each of the other collectors.

As described further above, each of the detection channels included in the output acquisition subsystem may be configured to detect scattered light. Therefore, the output acquisition subsystem shown in FIG. 1 may be configured for dark field (DF) imaging of specimens. However, the output acquisition subsystem may also or alternatively include detection channel(s) that are configured for bright field (BF) imaging of specimens. In other words, the output acquisition subsystem may include at least one detection channel that is configured to detect light specularly reflected from the specimen. Therefore, the output acquisition subsystems described herein may be configured for only DF, only BF, or both DF and BF imaging. Although each of the collectors are shown in FIG. 1 as single refractive optical elements, each of the collectors may include one or more refractive optical elements and/or one or more reflective optical elements.

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the output acquisition subsystem may be signals or data, but not image signals or image data. In such instances, a computer subsystem such as computer subsystem 36 may be configured to generate images of the specimen from the non-imaging output of the detectors. However, in other instances, the detectors may be configured as imaging detectors that are configured to generate imaging signals or image data. Therefore, the output acquisition subsystem may be configured to generate images in a number of ways.

It is noted that FIG. 1 is provided herein to generally illustrate a configuration of an output acquisition subsystem that may be included in the system embodiments described herein. Obviously, the output acquisition subsystem configuration described herein may be altered to optimize the performance of the output acquisition subsystem as is normally performed when designing a commercial system. In addition, the systems described herein may be implemented using an existing system (e.g., by adding functionality described herein to an existing system) such as the 29xx/39xx series of tools that are commercially available from KLA Corp., Milpitas, Calif. For some such systems, the methods described herein may be provided as optional functionality of the system (e.g., in addition to other functionality of the system). Alternatively, the system described herein may be designed "from scratch" to provide a completely new system.

Computer subsystem 36 may be coupled to the detectors of the output acquisition subsystem in any suitable manner (e.g., via one or more transmission media, which may include "wired" and/or "wireless" transmission media) such that the computer subsystem can receive the output generated by the detectors. Computer subsystem 36 may be configured to perform a number of functions with or without the output of the detectors including the steps and functions described further herein. As such, the steps described herein may be performed "on-tool," by a computer subsystem that is coupled to or part of an output acquisition subsystem. In addition, or alternatively, computer system(s) 102 may perform one or more of the steps described herein. Therefore, one or more of the steps described herein may be performed "off-tool," by a computer system that is not directly coupled to an output acquisition subsystem. Computer subsystem 36 and computer system(s) 102 may be further configured as described herein.

Computer subsystem 36 (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems. For example, computer subsystem 36 may be coupled to computer system(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the output acquisition subsystem is described above as being an optical or light-based output acquisition subsystem, in another embodiment, the output acquisition subsystem is configured as an electron-based output acquisition subsystem. In an electron beam output acquisition subsystem, the energy directed to the specimen includes electrons, and the energy detected from the specimen includes electrons. In one such embodiment shown in FIG. 2, the output acquisition subsystem includes electron column 122, and the system includes computer subsystem 124 coupled to the output acquisition subsystem. Computer subsystem 124 may be configured as described above. In addition, such an output acquisition subsystem may be coupled to another one or more computer systems in the same manner described above and shown in FIG. 1.

Figure 2:
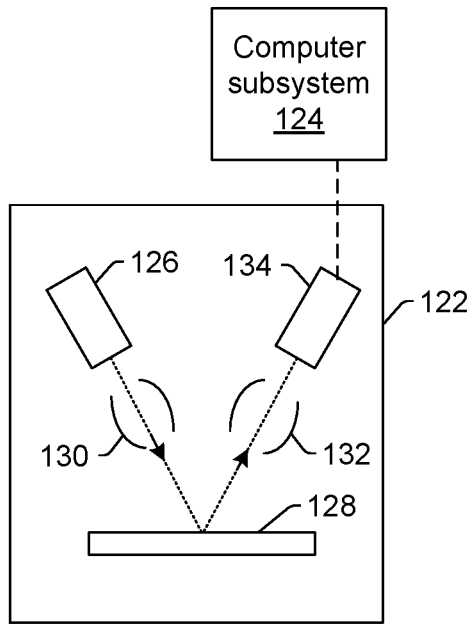

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, the electron beam may be directed to and scattered from the specimen at any suitable angles. In addition, the electron beam output acquisition subsystem may be configured to use multiple modes to generate output for the specimen as described further herein (e.g., with different illumination angles, collection angles, etc.). The multiple modes of the electron beam output acquisition subsystem may be different in any output generation parameters of the output acquisition subsystem.

Computer subsystem 124 may be coupled to detector 134 as described above. The detector may detect electrons returned from the surface of the specimen thereby forming electron beam images of (or other output for) the specimen. The electron beam images may include any suitable electron beam images. Computer subsystem 124 may be configured to determine information for the specimen using output generated by detector 134, which may be performed as described further herein. Computer subsystem 124 may be configured to perform any additional step(s) described herein. A system that includes the output acquisition subsystem shown in FIG. 2 may be further configured as described herein.

It is noted that FIG. 2 is provided herein to generally illustrate a configuration of an electron beam output acquisition subsystem that may be included in the embodiments described herein. As with the optical subsystem described above, the electron beam subsystem configuration described herein may be altered to optimize the performance of the output acquisition subsystem as is normally performed when designing a commercial system. In addition, the systems described herein may be implemented using an existing system (e.g., by adding functionality described herein to an existing system) such as tools that are commercially available from KLA. For some such systems, the methods described herein may be provided as optional functionality of the system (e.g., in addition to other functionality of the system). Alternatively, the system described herein may be designed "from scratch" to provide a completely new system.

Although the output acquisition subsystem is described above as being a light or electron beam subsystem, the output acquisition subsystem may be an ion beam output acquisition subsystem. Such an output acquisition subsystem may be configured as shown in FIG. 2 except that the electron beam source may be replaced with any suitable ion beam source known in the art. In addition, the output acquisition subsystem may include any other suitable ion beam output acquisition system such as those included in commercially available focused ion beam (FIB) systems, helium ion microscopy (HIM) systems, and secondary ion mass spectroscopy (SIMS) systems.

Figure 3:
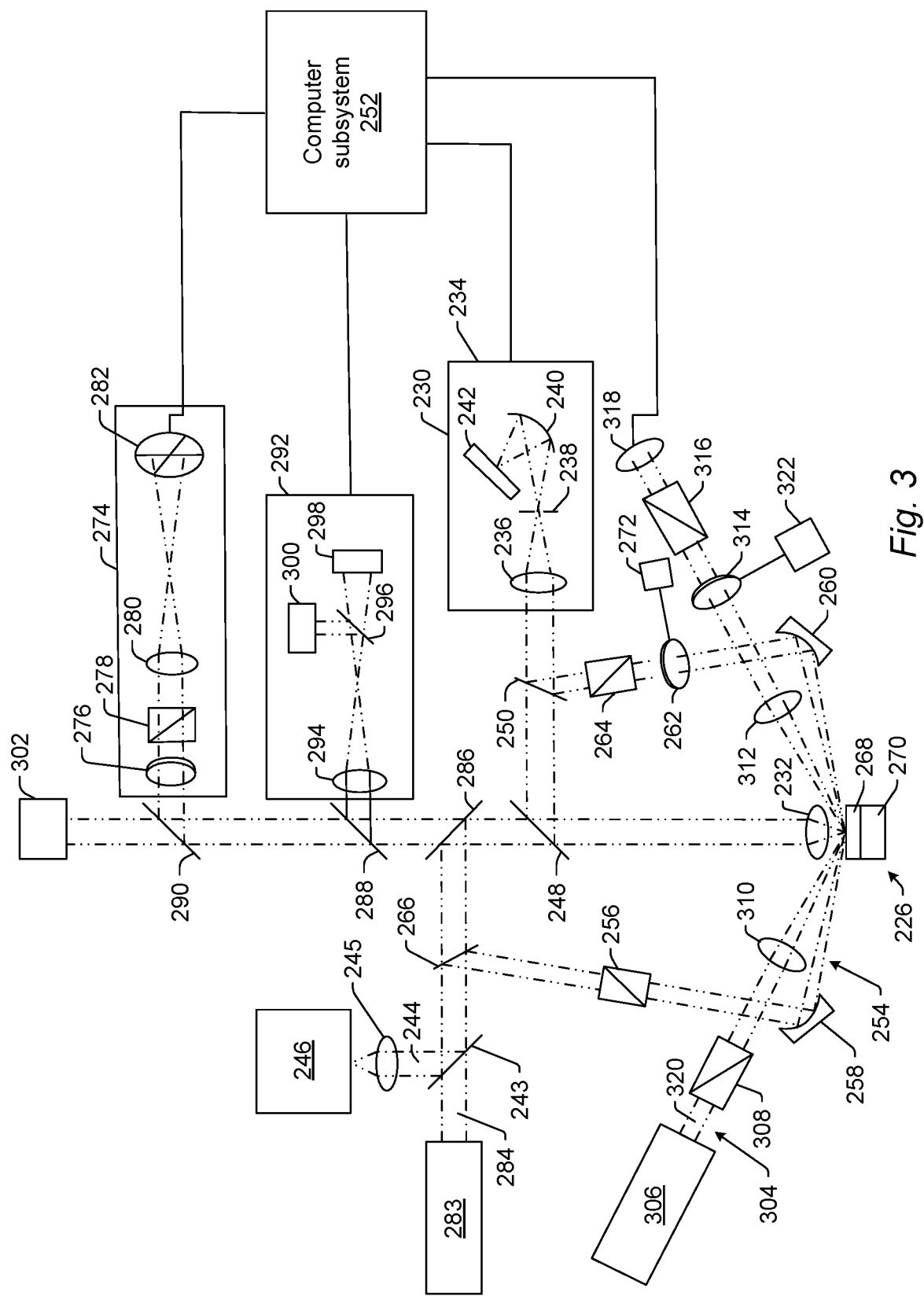

FIG. 3 illustrates another embodiment of a system that includes various light-based output acquisition subsystems. The output acquisition subsystems shown in FIG. 3 are described in more detail in U.S. Pat. No. 6,515,746 to Opsal et al., which is incorporated by reference as if fully set forth herein. Some of the non-essential details of the system presented in this patent have been omitted from the description corresponding to FIG. 3 presented herein. However, it is to be understood that the system illustrated in FIG. 3 may be further configured as described in this patent. In addition, it will be obvious upon reading the description of several embodiments provided herein that the system illustrated in FIG. 3 has been altered to improve upon the system described in U.S. Pat. No. 6,515,746 to Opsal et al. The alterations include compensating for temperature-induced variations to target location positions.

One of the output acquisition subsystems is configured as a broadband reflective spectrometer. Broadband reflective spectrometer (BRS) 230 simultaneously probes specimen 226 with multiple wavelengths of light. BRS 230 uses lens 232 and includes a broadband spectrometer 234 which can be of any type commonly known and used in the art. Lens 232 may be a transmissive optical component formed of a material such as calcium fluoride ($CaF_2$). Such a lens may be a spherical, microscope objective lens with a high numerical aperture (on the order of 0.90 NA) to create a large spread of angles of incidence with respect to the specimen surface, and to create a spot size of about one micron in diameter. Alternatively, lens 232 may be a reflective optical component. Such a lens may have a lower numerical aperture (on the order of 0.4 NA) and may be capable of focusing light to a spot size of about 10-15 microns. Spectrometer 234 shown in FIG. 3 includes lens 236, aperture 238, dispersive element 240, and detector array 242. Lens 236 may be formed of $CaF_2$.

During operation, probe beam 244 from light source 246 is collimated by lens 245, directed by mirror 243 through mirror 266 to mirror 286, which directs the light through mirror 248 to lens 232, which is then focused onto specimen 226 by lens 232. The light source may include any of the light sources described above. Lens 245 may be formed of $CaF_2$.

Light reflected from the surface of the specimen passes through lens 232 and is directed by mirror 248 (through mirror 250) to spectrometer 234. Lens 236 focuses the probe beam through aperture 238, which defines a spot in the field of view on the specimen surface to analyze. Dispersive element 240, such as a diffraction grating, prism, or holographic plate, angularly disperses the beam as a function of wavelength to individual detector elements contained in detector array 242.

The different detector elements measure the optical intensities of different wavelengths of light contained in the probe beam, preferably simultaneously. Alternately, detector 242 can be a charge-coupled device ("CCD") camera or a photomultiplier with suitably dispersive or otherwise wavelength selective optics. It should be noted that a monochrometer could be used to measure the different wavelengths serially (one wavelength at a time) using a single detector element. Further, dispersive element 240 can also be configured to disperse the light as a function of wavelength in one direction, and as a function of the angle of incidence with respect to the specimen surface in an orthogonal direction, so that simultaneous measurements as a function of both wavelength and angle of incidence are possible. Computer subsystem 252 processes the intensity information measured by detector array 242.

Broadband spectroscopic ellipsometer (BSE) 254 is also configured to perform measurements of the specimen using light. BSE 254 includes polarizer 256, focusing mirror 258, collimating mirror 260, rotating compensator 262, and analyzer 264. In some embodiments, BSE 254 may be configured to perform measurements of the specimen using light provided by light source 246, light source 283, or another light source (not shown).

In operation, mirror 266 directs at least part of probe beam 244 to polarizer 256, which creates a known polarization state for the probe beam, preferably a linear polarization. Mirror 258 focuses the beam onto the specimen surface at an oblique angle, ideally on the order of 70 degrees to the normal of the specimen surface. Based upon well known ellipsometric principles, the reflected beam will generally have a mixed linear and circular polarization state after interacting with the specimen, based upon the composition and thickness of the specimen's film 268 and substrate 270.

The reflected beam is collimated by mirror 260, which directs the beam to rotating compensator 262. Compensator 262 introduces a relative phase delay δ (phase retardation) between a pair of mutually orthogonal polarized optical beam components. Compensator 262 is rotated at an angular velocity c about an axis substantially parallel to the propagation direction of the beam, preferably by electric motor 272. Analyzer 264, preferably another linear polarizer, mixes the polarization states incident on it. By measuring the light transmitted by analyzer 264, the polarization state of the reflected probe beam can be determined.

Mirror 250 directs the beam to spectrometer 234, which simultaneously measures the intensities of the different wavelengths of light in the reflected probe beam that pass through the compensator/analyzer combination. Computer subsystem 252 receives the output of detector 242, and processes the intensity information measured by detector 242 as a function of wavelength and as a function of the azimuth (rotational) angle of compensator 262 about its axis of rotation, to solve the ellipsometric values w and A as described in U.S. Pat. No. 5,877,859 to Aspnes et al., which is incorporated by reference as if fully set forth herein.

A system that includes the broadband reflective spectrometer and broadband spectroscopic ellipsometer described above may also include additional output acquisition subsystem(s) configured to perform additional measurements of the specimen using light. For example, the system may include output acquisition subsystems configured as a beam profile ellipsometer, a beam profile reflectometer, another optical subsystem, or a combination thereof.

Beam profile ellipsometry (BPE) is discussed in U.S. Pat. No. 5,181,080 to Fanton et al., which is incorporated by reference as if fully set forth herein. BPE 274 includes laser 283 that generates probe beam 284. Laser 283 may be a solid state laser diode from Toshiba Corp. which emits a linearly polarized 3 mW beam at 673 nm. BPE 274 also includes quarter wave plate 276, polarizer 278, lens 280, and quad detector 282. In operation, linearly polarized probe beam 284 is focused on specimen 226 by lens 232. Light reflected from the specimen surface passes up through lens 232 and mirrors 248, 286, and 288, and is directed into BPE 274 by mirror 290.

The position of the rays within the reflected probe beam correspond to specific angles of incidence with respect to the specimen's surface. Quarter-wave plate 276 retards the phase of one of the polarization states of the beam by 90 degrees. Linear polarizer 278 causes the two polarization states of the beam to interfere with each other. For maximum signal, the axis of polarizer 278 should be oriented at an angle of 45 degrees with respect to the fast and slow axis of quarter-wave plate 276. Detector 282 is a quad-cell detector with four radially disposed quadrants that each intercept one quarter of the probe beam and generate a separate output signal proportional to the power of the portion of the probe beam striking that quadrant.

The output signals from each quadrant are sent to computer subsystem 252. By monitoring the change in the polarization state of the beam, ellipsometric information, such as w and A, can be determined. To determine this information, computer subsystem 252 takes the difference between the sums of the output signals of diametrically opposed quadrants, a value which varies linearly with film thickness for very thin films.

Beam profile reflectometry (BPR) is discussed in U.S. Pat. No. 4,999,014 to Gold et al., which is incorporated by reference as if fully set forth herein. BPR 292 includes laser 283, lens 294, beam splitter 296, and two linear detector arrays 298 and 300 to measure the reflectance of the sample. In operation, linearly polarized probe beam 284 is focused onto specimen 226 by lens 232, with various rays within the beam striking the specimen surface at a range of angles of incidence. Light reflected from the specimen surface passes up through lens 232 and mirrors 248 and 286, and is directed into BPR 292 by mirror 288. The position of the rays within the reflected probe beam correspond to specific angles of incidence with respect to the specimen's surface. Lens 294 spatially spreads the beam two-dimensionally. Beam splitter 296 separates the S and P components of the beam, and detector arrays 298 and 300 are oriented orthogonal to each other to isolate information about S and P polarized light. The higher angles of incidence rays will fall closer to the opposed ends of the arrays. The output from each element in the diode arrays will correspond to different angles of incidence. Detectors arrays 298 and 300 measure the intensity across the reflected probe beam as a function of the angle of incidence with respect to the specimen surface. Computer subsystem 252 receives the output of detector arrays 298 and 300, and derives the thickness and refractive index of thin film layer 268 based on these angular dependent intensity measurements by utilizing various types of modeling algorithms. Optimization routines which use iterative processes such as least square fitting routines are typically employed.

The system shown in FIG. 3 may also include additional components such as detector/camera 302. Detector/camera 302 is positioned above mirror 290, and can be used to view reflected beams off of specimen 226 for alignment and focus purposes.

In order to calibrate BPE 274, BPR 292, BRS 230, and BSE 254, the system may include wavelength stable calibration reference ellipsometer 304 used in conjunction with a reference sample (not shown). For calibration purposes, the reference sample ideally consists of a thin oxide layer having a thickness, d, formed on a silicon substrate. However, in general the sample can be any appropriate substrate of known composition, including a bare silicon wafer, and silicon wafer substrates having one or more thin films thereon. The thickness d of the layer need not be known or be consistent between periodic calibrations.

Ellipsometer 304 includes light source 306, polarizer 308, lenses 310 and 312, rotating compensator 314, analyzer 316, and detector 318. Compensator 314 is rotated at an angular velocity ψ about an axis substantially parallel to the propagation direction of beam 320, preferably by electric motor 322. It should be noted that the compensator can be located either between the specimen and the analyzer (as shown in FIG. 3) or between the specimen and polarizer 308. It should also be noted that polarizer 308, lenses 310 and 312, compensator 314, and polarizer 316 are all optimized in their construction for the specific wavelength of light produced by light source 306, which maximizes the accuracy of ellipsometer.

Light source 306 produces a quasi-monochromatic probe beam 320 having a known stable wavelength and stable intensity. This can be done passively, where light source 306 generates a very stable output wavelength which does not vary over time (i.e., varies less than 1%). Examples of passively stable light sources are a helium-neon laser, or other gas discharge laser systems. Alternately, a non-passive system can be used where the light source includes a light generator (not shown) that produces light having a wavelength that is not precisely known or stable over time, and a monochrometer (not shown) that precisely measures the wavelength of light produced by the light generator. Examples of such light generators include laser diodes, or polychromatic light sources used in conjunction with a color filter such as a grating. In either case, the wavelength of beam 320, which is a known constant or measured by a monochrometer, is provided to computer subsystem 252 so that ellipsometer 304 can accurately calibrate the optical measurement devices in the system.

Operation of ellipsometer 304 during calibration is further described in U.S. Pat. No. 6,515,746. Briefly, beam 320 enters detector 318, which measures the intensity of the beam passing through the compensator/analyzer combination. Computer subsystem 252 processes the intensity information measured by detector 318 to determine the polarization state of the light after interacting with the analyzer, and therefore the ellipsometric parameters of the specimen. This information processing includes measuring beam intensity as a function of the azimuth (rotational) angle of the compensator about its axis of rotation. This measurement of intensity as a function of compensator rotational angle is effectively a measurement of the intensity of beam 320 as a function of time, since the compensator angular velocity is usually known and a constant.

By knowing the composition of the reference sample, and by knowing the exact wavelength of light generated by light source 306, the optical properties of the reference sample such as film thickness d, refractive index and extinction coefficients, etc., can be determined by ellipsometer 304. Once the thickness d of the film has been determined by ellipsometer 304, then the same sample is probed by the other optical measurement devices BPE 274, BPR 292, BRS 230, and BSE 254 which measure various optical parameters of the sample. Computer subsystem 252 then calibrates the processing variables used to analyze the results from these optical measurement devices so that they produce accurate results. In the above described calibration techniques, all system variables affecting phase and intensity are determined and compensated for using the phase offset and reflectance normalizing factor discussed in U.S. Pat. No. 6,515,746, thus rendering the optical measurements made by these calibrated optical measurement devices absolute.

The above described calibration techniques are based largely upon calibration using the derived thickness d of the thin film. However, calibration using ellipsometer 304 can be based upon any of the optical properties of the reference sample that are measurable or determinable by ellipsometer 304 and/or are otherwise known, whether the sample has a single film thereon, has multiple films thereon, or even has no film thereon (bare sample).

In some embodiments, the output acquisition subsystems may have at least one common optical component. For example, lens 232 is common to BPE 274, BPR 292, BRS 230, and BSE 254. In a similar manner, mirrors 243, 266, 286, and 248 are common to BPE 274, BPR 292, BRS 230, and BSE 254. Ellipsometer 304, as shown in FIG. 3, does not have any optical components that are common to the other output acquisition subsystems. Such separation from the other output acquisition subsystems may be appropriate since the ellipsometer is used to calibrate the other output acquisition subsystems.

As further noted above, the output acquisition subsystem may be configured to have multiple modes. In general, a "mode" is defined by the values of parameters of the output acquisition subsystem used to generate output for the specimen. Therefore, modes that are different may be different in the values for at least one of the output generation parameters of the output acquisition subsystem (other than position on the specimen at which the output is generated). For example, for a light-based output acquisition subsystem, different modes may use different wavelengths of light. The modes may be different in the wavelengths of light directed to the specimen as described further herein (e.g., by using different light sources, different spectral filters, etc. for different modes). In another embodiment, different modes may use different illumination channels. For example, as noted above, the output acquisition subsystem may include more than one illumination channel. As such, different illumination channels may be used for different modes.

The multiple modes may also be different in illumination and/or collection/detection. For example, as described further above, the output acquisition subsystem may include multiple detectors. Therefore, one of the detectors may be used for one mode and another of the detectors may be used for another mode. Furthermore, the modes may be different from each other in more than one way described herein (e.g., different modes may have one or more different illumination parameters and one or more different detection parameters). In addition, the multiple modes may be different in perspective, meaning having either or both of different angles of incidence and angles of collection, which are achievable as described further above. The output acquisition subsystem may be configured to scan the specimen with the different modes in the same scan or different scans, e.g., depending on the capability of using multiple modes to scan the specimen at the same time.

In some instances, the systems described herein may be configured as inspection systems. However, the systems described herein may be configured as another type of semiconductor-related quality control type system such as a defect review system and a metrology system. For example, the embodiments of the output acquisition subsystems described herein and shown in FIGS. 1-3 may be modified in one or more parameters to provide different output generation capability depending on the application for which they will be used. In one embodiment, the output acquisition subsystem is configured as an electron beam defect review subsystem. For example, the output acquisition subsystem shown in FIG. 2 may be configured to have a higher resolution if it is to be used for defect review or metrology rather than for inspection. In other words, the embodiments of the output acquisition subsystem shown in FIGS. 1-3 describe some general and various configurations for an output acquisition subsystem that can be tailored in a number of manners that will be obvious to one skilled in the art to produce output acquisition subsystems having different output generation capabilities that are more or less suitable for different applications.

As noted above, the output acquisition subsystem may be configured for directing energy (e.g., light, electrons) to and/or scanning energy over a physical version of the specimen thereby generating actual output for the physical version of the specimen. In this manner, the output acquisition subsystem may be configured as an "actual" output acquisition system, rather than a "virtual" system. However, a storage medium (not shown) and computer system(s) 102 shown in FIG. 1 and/or other computer subsystems shown and described herein may be configured as a "virtual" system. In particular, the storage medium and computer system(s) 102 are not part of output acquisition subsystem 100 and do not have any capability for handling the physical version of the specimen but may be configured as a virtual inspector that performs inspection-like functions, a virtual metrology system that performs metrology-like functions, a virtual defect review tool that performs defect review-like functions, etc. using stored detector output. Systems and methods configured as "virtual" systems are described in commonly assigned U.S. Pat. No. 8,126,255 issued on Feb. 28, 2012 to Bhaskar et al., U.S. Pat. No. 9,222,895 issued on Dec. 29, 2015 to Duffy et al., and U.S. Pat. No. 9,816,939 issued on Nov. 14, 2017 to Duffy et al., which are incorporated by reference as if fully set forth herein. The embodiments described herein may be further configured as described in these patents. For example, a computer subsystem described herein may be further configured as described in these patents.

One embodiment of a system configured to determine information for a specimen includes an output acquisition subsystem configured to generate output for a specimen at one or more target locations on the specimen. The one or more target locations may be predetermined target locations that are stored in a recipe for the process performed on the specimen with the output acquisition subsystem. The one or more target locations may also be discrete locations such as those used in move-acquire-measure type measurement processes or defined by areas on the specimen to be scanned as in an inspection or scanning type process. In this manner, the target locations indicate where on a specimen a process is supposed to be performed, but as described further herein, even with state of the art specimen positioning methods and systems, the process may not always be performed at the intended target locations. As described further herein, the embodiments described herein are intended to minimize the differences between the intended target locations and the actual target locations and/or to correct the target locations at which a process was performed. By predicting specimen positioning errors due to temperature, the embodiments described herein can improve the performance and usefulness of the quality control type processes and tools described herein.

In one embodiment, the output acquisition subsystem is configured as a metrology subsystem. As described above, the output acquisition subsystems shown in FIGS. 1-3 may be configured as metrology subsystems. In this manner, the embodiments described herein may be configured as metrology tools. In the field of semiconductor metrology, a metrology tool may include an illumination subsystem which illuminates a target, a collection subsystem which captures relevant information provided by the illumination subsystem's interaction (or lack thereof) with a target, device or feature, and a computer subsystem which analyzes the information collected using one or more algorithms. Metrology tools can be used to measure structural and material characteristics (e.g., material composition, dimensional characteristics of structures and films such as film thickness and/or critical dimensions (CDs) of structures, overlay, etc.) associated with various semiconductor fabrication processes. These measurements are used to facilitate process control and/or yield efficiencies in the manufacture of semiconductor dies.

The metrology tool can include one or more hardware configurations which may be used in conjunction with certain embodiments described herein to, e.g., measure the various aforementioned semiconductor structural and material characteristics. Examples of such hardware configurations include, but are not limited to, the following.

1. Spectroscopic ellipsometer (SE)
2. SE with multiple angles of illumination
3. SE measuring Mueller matrix elements (e.g. using rotating compensator(s))
4. Single-wavelength ellipsometers
5. Beam profile ellipsometer (angle-resolved ellipsometer)
6. Beam profile reflectometer (angle-resolved reflectometer)
7. Broadband reflective spectrometer (spectroscopic reflectometer)
8. Single-wavelength reflectometer
9. Angle-resolved reflectometer
10. Imaging system 11. Scatterometer (e.g. speckle analyzer)

The hardware configurations can be separated into discrete operational systems. On the other hand, one or more hardware configurations can be combined into a single tool. One example of such a combination of multiple hardware configurations into a single tool is shown in FIG. 3, which may be further configured as described in U.S. Pat. No. 7,933,026 to Opsal et al., which is incorporated by reference as if fully set forth herein. The systems described herein may be further configured as described in this reference.

FIG. 3 shows, for example, a schematic of an exemplary metrology tool that comprises: a) a broadband SE (i.e., 254); b) a SE (i.e., 304) with rotating compensator (i.e., 314); c) a beam profile ellipsometer (i.e., 274); d) a beam profile reflectometer (i.e., 292); e) a broadband reflective spectrometer (i.e., 230); and f) a deep ultraviolet reflective spectrometer (i.e., 230). In addition, there are typically numerous optical elements in such systems, including certain lenses, collimators, mirrors, quarter-wave plates, polarizers, detectors, cameras, apertures, and/or light sources. The wavelengths for optical systems can vary from about 120 nm to 3 microns. For non-ellipsometer systems, signals collected can be polarization-resolved or unpolarized. FIG. 3 provides an illustration of multiple metrology heads integrated on the same tool. However, in many cases, multiple metrology tools are used for measurements on a single or multiple metrology targets, which is described, e.g. in U.S. Pat. No. 7,478,019 to Zangooie et al, which is incorporated by reference as if fully set forth herein. The embodiments described herein may be further configured as described in this reference.

The illumination subsystem of the certain hardware configurations includes one or more light sources. The light source may generate light having only one wavelength (i.e., monochromatic light), light having a number of discrete wavelengths (i.e., polychromatic light), light having multiple wavelengths (i.e., broadband light) and/or light that sweeps through wavelengths, either continuously or hopping between wavelengths (i.e., tunable sources or swept sources). Examples of suitable light sources include, but are not limited to, a white light source, an ultraviolet (UV) laser, an arc lamp or an electrode-less lamp, a laser sustained plasma (LSP) source such as those commercially available from Energetiq Technology, Inc., Woburn, Massachusetts, a supercontinuum source (such as a broadband laser source) such as those commercially available from NKT Photonics Inc., Morganville, New Jersey, or shorter-wavelength sources such as x-ray sources, extreme UV sources, or some combination thereof. The light source may also be configured to provide light having sufficient brightness, which in some cases may be a brightness greater than about 1 W/(nm $cm^2$ Sr). The metrology system may also include a fast feedback to the light source for stabilizing its power and wavelength. Output of the light source can be delivered via free-space propagation, or in some cases delivered via optical fiber or light guide of any type.

The metrology tool may be designed to make many different types of measurements related to semiconductor manufacturing. Certain embodiments described herein may be applicable to such measurements. For example, in certain embodiments, the tool may measure characteristics of one or more targets, such as critical dimensions, overlay, sidewall angles, film thicknesses, process-related parameters (e.g., focus and/or dose). The targets can include certain regions of interest that are periodic in nature such as, for example, gratings in a memory die. Targets can include multiple layers (or films) whose thicknesses can be measured by the metrology tool. Targets can include target designs placed (or already existing) on the specimen for use, e.g., with alignment and/or overlay registration operations. Certain targets can be located at various places on the specimen. For example, targets can be located within the scribe lines (e.g., between dies) and/or located in the die itself. In certain embodiments, multiple targets are measured (at the same time or at differing times) by the same or multiple metrology tools as described in U.S. Pat. No. 7,478,019 to Zangooie et al. The data from such measurements may be combined. Data from the metrology tool is used in the semiconductor manufacturing process for example to feed-forward, feed-backward and/or feed-sideways corrections to the process (e.g. lithography, etch) and therefore, might yield a complete process control solution.

As semiconductor device pattern dimensions continue to shrink, smaller metrology targets are often required. Furthermore, the measurement accuracy and matching to actual device characteristics increase the need for device-like targets as well as in-die and even on-device measurements. Various metrology implementations have been proposed to achieve that goal. For example, focused beam ellipsometry based on primarily reflective optics is one of them and described in U.S. Pat. No. 5,608,526 to Piwonka-Corle et al., which is incorporated by reference as if fully set forth herein. The embodiments described herein may be further configured as described in this patent. Apodizers can be used to mitigate the effects of optical diffraction causing the spread of the illumination spot beyond the size defined by geometric optics. The use of apodizers is described in U.S. Pat. No. 5,859,424 to Norton, which is incorporated by reference as if fully set forth herein. The embodiments described herein may be further configured as described in this patent. The use of high-numerical-aperture tools with simultaneous multiple angle-of-incidence illumination is another way to achieve small-target capability. This technique is described, e.g., in U.S. Pat. No. 6,429,943 to Opsal et al, which is incorporated by reference as if fully set forth herein. The embodiments described herein may be further configured as described in this patent.

Other measurement examples may include measuring the composition of one or more layers of the semiconductor stack or the specimen, measuring certain defects on (or within) the specimen, and measuring the amount of photolithographic radiation exposed to the specimen. In some cases, metrology tool and algorithm may be configured for measuring non-periodic targets, see e.g. U.S. Pat. No. 9,291,554 to Kuznetsov et al. issued Mar. 22, 2016 and U.S. Pat. No. 9,915,522 to Jiang et al. issued Mar. 13, 2018, which are incorporated by reference as if fully set forth herein. The embodiments described herein may be further configured as described in these patents.

Measurement of parameters of interest usually involves a number of algorithms. For example, optical interaction of the incident beam with the specimen is modeled using EM (electro-magnetic) solver and uses such algorithms as RCWA, FEM, method of moments, surface integral method, volume integral method, FDTD, and others. The target of interest is usually modeled (parametrized) using a geometric engine or, in some cases, a process modeling engine or a combination of both. The use of process modeling is described in U.S. Pat. No. 10,769,320 to Kuznetsov et al. issued Sep. 8, 2020, which is incorporated by reference as if fully set forth herein. The embodiments described herein may be further configured as described in this patent. A geometric engine is implemented, for example, in the AcuShape software product of KLA.

Collected data can be analyzed by a number of data fitting and optimization techniques and technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others.

Collected data can also be analyzed by algorithms that do not include modeling, optimization and/or fitting as described, for example, in U.S. Pat. No. 10,591,406 to Bringoltz et al. issued Mar. 17, 2020, which is incorporated by reference as if fully set forth herein. The embodiments described herein may be further configured as described in this patent.

Computational algorithms are usually optimized for metrology applications with one or more approaches being used such as design and implementation of computational hardware, parallelization, distribution of computation, load-balancing, multi-service support, dynamic load optimization, etc. Different implementations of algorithms can be done in firmware, software, FPGA, programmable optics components, etc.

The data analysis and fitting steps usually pursue one or more of the following goals:
1. Measurement of critical dimension (CD), side wall angle (SWA), shape, stress, composition, films, bandgap, electrical properties, focus/dose, overlay, generating process parameters (e.g., resist state, partial pressure, temperature, focusing model), and/or any combination thereof;
2. Modeling and/or design of metrology systems; and
3. Modeling, design, and/or optimization of metrology targets.

The embodiments described herein configured for the field of semiconductor metrology are not limited to the hardware, algorithm/software implementations and architectures, and use cases summarized above.

In another embodiment, the output acquisition subsystem is configured as an inspection subsystem. The inspection subsystem may be configured for performing inspection using light, electrons, or another energy type such as ions. Such an output acquisition subsystem may be configured, for example, as shown in FIGS. 1 and 2. In systems in which the output acquisition subsystem is configured as an inspection subsystem, the computer subsystem may be configured for detecting defects on the specimen based on the output generated by the output acquisition subsystem. For example, in possibly the simplest scenario, the computer subsystem may subtract a reference from the output thereby generating a difference signal or image and then apply a threshold to the difference signal or image. The computer subsystem may determine that any difference signal or image having a value above the threshold is a defect or potential defect and that any difference signal or image having a value below the threshold is not a defect or potential defect. Of course, many defect detection methods and algorithms used on commercially available inspection tools are much more complicated than this example, and any such methods or algorithms may be applied to the output generated by the output acquisition subsystem configured as an inspection subsystem.

In a similar manner, the process may be a defect review process. Unlike inspection processes, a defect review process generally revisits discrete locations on a specimen at which a defect has been detected. An output acquisition subsystem configured for defect review may generate specimen images as described herein, which may be used to determine one or more attributes of the defect like a defect shape, dimensions, roughness, background pattern information, etc. and/or a defect classification (e.g., a bridging type defect, a missing feature defect, etc.). For defect review applications, the computer subsystem may be configured for using any suitable defect review method or algorithm used on any suitable defect review tool to determine information for the defect or the specimen from the output generated by the output acquisition subsystem.

In some embodiments, the output acquisition subsystem is a light-based subsystem. Such an output acquisition subsystem may be further configured as described herein and shown in FIGS. 1 and 3. In other embodiments, the output acquisition subsystem is an electron-based subsystem. Such an output acquisition subsystem may be further configured as described herein and shown in FIG. 2. Therefore, as can be seen from the above description, the embodiments described herein may be used with output acquisition subsystems having many different characteristics. In general, the embodiments described herein can be used in any tool in which temperatures can be measured near or in the hardware elements responsible for positioning the specimen within the tool during runtime and can measure position error when navigating across the specimen during calibration.

The system also includes one or more temperature sensors configured to measure one or more temperatures within the system. In general, the temperature sensors that are included in the system and whose measured temperatures are used as described further herein for position correction may include any or all of the temperature sensors already installed on the system. In one such example, the temperatures may include any or all of the following temperatures: Y front temperature recorded in the tool (also referred to to herein as the "Y_TEMP_FRONT"), Y back temperature recorded in the tool (also referred to herein as the "Y_TEMP_BACK"), X temperature recorded in the tool (also referred to herein as the "X_TEMP"), a carriage temperature recorded in the tool (also referred to herein as the "CARRIAGE_TEMP"), theta temperature recorded in the tool (also referred to herein as the "T_TEMP"), and Y plate temperature recorded in the tool (also referred to herein as the "Y_PLATE_TEMP").

Y_TEMP_FRONT is the temperature of the first of two linear motors that work together along the Y direction of the specimen handling stage. Y_TEMP_BACK is the temperature of the second of those two linear motors. X_TEMP is the temperature of the X axis linear motor that works along the X direction of the specimen handling stage, and there may be only one temperature for the X direction if the X axis motor is a single linear motor (unlike the Y axis motor which can be two linear motors working together). The CARRIAGE_TEMP may be measured by a temperature sensor installed near and somewhat underneath the specimen chuck and may be on the specimen handling stage. The T_TEMP may be instrumented with a resistance temperature detector (RTD) near the theta axis winding. The Y_PLATE_TEMP is a temperature of a specific component of some specimen handling stages.

While these temperature measurements and temperature sensors may be useful for many tools, they are included herein merely as illustrative examples and due to all of the possible variations of the motors and other components that may be included in the specimen handling subsystem, the inventors have deliberately chosen to illustrate the scanning subsystem and temperature sensors in a relatively abstract way in the figures described further herein. In particular, the exact location of the various temperature sensors for the various temperatures described above is likely not going to have a large impact on the implementation of the embodiments described herein. As long as one measures temperatures at or near at least some (i.e., one or more) of the hardware elements of the scanning subsystem primarily responsible for specimen positioning, one should be able to train a DL model to predict target location error from temperature measurements. If through training and testing, a DL model does not exhibit satisfactory performance, the temperature sensor(s) can be altered or supplemented with additional temperature sensor(s) until a sensor configuration is found that provides the DL model with sufficient data to enable sufficiently accurate prediction. Such experimentation and testing is well within the skill of practitioners in the art and will vary depending on the configuration of the tool.

In one embodiment, the one or more temperature sensors are configured to measure the one or more temperatures during a process performed with the output acquisition subsystem for the specimen. For example, after the DL model is trained as described herein and is ready for use during runtime, the one or more temperature sensors may collect temperature measurements while the specimen is being scanned or measured with the output acquisition subsystem. The sampling rate for the temperature sensors may be set based on how much of a temperature change can cause a change in positioning accuracy and possibly any information for how fast temperature can change in the vicinity of the scanning subsystem. In one such non-limiting example, the sampling rate for the temperature sensor(s) may be set so that a 0.1° C. change in the temperature in the tool will be detected. In this case, that would mean a sampling rate of about 1 sample every 30 sec or so.

Measuring the temperatures during the process can mean a couple of different things depending on the configuration and capability of the tool. For example, the temperature(s) may be measured continuously once the specimen has been loaded into the tool and is ready to be measured or scanned. However, given that the temperature can almost always be expected to change relatively slowly, continuous temperature measurements are probably not needed. As described above, a sampling rate of about 1 sample every 30 seconds or so may be sufficient. Whether or not those temperature measurements and error predictions are performed while the system is performing another task like measurement, output acquisition (e.g., imaging), specimen positioning, etc. may vary depending on data collection and processing capabilities of the system. For example, temperature measurements and error predictions may be interspersed with specimen positioning and measurement in metrology because temperature measurements and error predictions will be performed much less frequently than the other functions. In other applications like inspection in which a relatively large area of a specimen may be scanned while output is continuously (or nearly continuously) generated, it may be most practical to acquire temperature measurements during the scanning, meaning at the same time that output acquisition is being performed. In this manner, measuring the temperatures during the process can mean measuring temperatures at the same time as the specimen is being measured, inspected, imaged, etc. or in the time between when the process was started and when it finished.

In another embodiment, the one or more temperature sensors are configured to measure the one or more temperatures at or within one or more hardware elements of the system configured to alter a position of the specimen within the system. In this manner, the temperature sensor(s) may be configured to measure temperature(s) at one or more positions near or within the scanning subsystems described herein. In one such example, the system may include temperature sensors 40, 42, 44, and 46 shown in FIG. 1. Temperature sensors 40 and 42 are disposed under stage 22 (i.e., on the side of stage 22 opposite specimen 14). These temperature sensors may be coupled directly to the stage or they may be located within one or more additional elements (not shown) coupled to the stage, which may include mechanical and/or robotic elements that are configured to move the stage. These temperature sensors may be located at positions that are opposite to each other along a diameter of the stage that defines, for example, the X or Y axis of the stage. These temperature sensors may be located at other positions too, like along different diameters and therefore different axes of the stage. The temperature sensors may also be located at different distances from the center of the stage. The exact position of the sensors may in some respects be determined based on the exact hardware configuration of the scanning subsystem such as where there are spaces within the hardware that can accommodate the temperature sensors.

Temperature sensor 44 is shown located within stage 22. This temperature sensor position is intended to show how a temperature sensor may be located within a hardware element of the scanning subsystem. In some instances, it may not be actually useful to have a temperature sensor within the stage. If the temperature sensor is located within the stage, it would obviously be preferably configured so that any contact between the temperature sensor and the specimen is minimized to avoid the temperature sensor altering the specimen in any manner. A temperature sensor that is "within a hardware element" of the scanning subsystem may also not be wholly contained within a single hardware element of the scanning subsystem. For example, such a temperature sensor may be only partially enclosed by a hardware element of the scanning subsystem. In addition, such a temperature sensor may be entirely enclosed within a space formed between multiple hardware elements of the system. In this manner, the temperature sensors may be within the scanning subsystem but not necessarily within any single hardware element of the scanning subsystem (although that is also possible).

Temperature sensor 46 is shown coupled to an outside edge of stage 22 in FIG. 1. This temperature sensor may be fixedly attached to the outside edge of the stage if the configuration of the tool so allows. Having a temperature sensor positioned at an outside edge of the stage (or an outside edge of the scanning subsystem by such attachment to a different hardware element of the scanning subsystem) may be advantageous because it may be appropriate and even advantageous to measure one or more temperatures that are somewhat outside of the scanning subsystem and/or are exposed to the ambient environment within the tool housing (not just the scanning subsystem). While such a temperature sensor is shown attached to the stage, the temperature sensor may alternatively be positioned near the stage or another scanning subsystem hardware element and not necessarily attached to it.

The temperature sensors shown in FIG. 1 are intended to illustrate some possibly advantageous locations for the temperature sensors but are by no means meant to limit the embodiments described herein in the temperature sensor configurations that can be used with the embodiments. For example, in addition to the temperature sensors shown in FIG. 1, the system may include one or more temperature sensors (not shown) that are spaced from the scanning subsystem, that are attached to the housing of the system, that are attached to one or more imaging elements of the system, that are configured to measure a temperature of the specimen in a non-contact or contact manner, etc. In addition, although four temperature sensors are shown in FIG. 1 and a particular number of measured temperature examples are described further herein, it should be clear that the system may include any suitable number of temperature sensors arranged in any suitable configuration. Furthermore, the temperature sensors described herein can be any suitable commercially available sensors, which can be selected based on various information about the tool such as expected temperature range, size considerations, expected measurement frequency, environmental conditions within the tool, etc. In some instances, the temperature sensors that are installed on a tool for other purposes can be used to measure and record the various temperatures described herein and/or other temperatures that may be suitable for use by the embodiments described herein. For tools that have pre-existing temperature sensors, one could attempt to train a DL model using the temperatures measured by those pre-existing sensors, and if the trained DL model does not pass testing and validation, the addition of more temperature sensors could be explored as a way to improve the performance of the DL model.

The system further includes a computer subsystem configured to acquire the one or more measured temperatures from the one or more temperature sensors. The computer subsystem may include and have any configuration of any of the computer subsystem(s) or system(s) described herein. Acquiring the one or more measured temperatures may be performed in the same manner described above with respect to acquiring the output generated by the output acquisition subsystem. For example, computer subsystem 36 shown in FIG. 1 may be coupled to the temperature sensors in any suitable manner (e.g., via one or more transmission media, which may include "wired" and/or "wireless" transmission media) such that the computer subsystem can receive the temperature measurements generated by the temperature sensors. Computer subsystem 36 may be configured to perform a number of functions with or without the output of the temperature sensors including the steps and functions described further herein. As described further herein, the one or more measured temperatures acquired by the computer subsystem may include a variety of information in addition to the actual temperature measurements such as time and space information associated with the temperature measurements. That additional information may be generated and acquired as described further herein.

The system includes one or more components executed by the computer subsystem. For example, as shown in FIG. 1, the system includes one or more components 104 executed by computer subsystem 36 and/or computer system(s) 102. Systems shown in other figures described herein may be configured to include similar elements. The one or more components may be executed by the computer subsystem as described further herein or in any other suitable manner known in the art. At least part of executing the one or more components may include inputting one or more inputs, such as acquired temperatures, data, etc., into the one or more components. The computer subsystem may be configured to input any measured temperature data, etc. into the one or more components in any suitable manner.

The one or more components include a deep learning (DL) model configured for predicting error in at least one of the one or more target locations based on at least one of the one or more measured temperatures input to the DL model by the computer subsystem. For example, as shown in FIG. 1, one or more components 104 include DL model 106. The embodiments described herein utilize an understanding of domain knowledge including a correlation between temperatures in the tool and position error in X and/or Y. The one or more measured temperatures that are input to the DL model may include any information generated by or associated with the temperature measurements such as time, space, and sensor ID information associated with a measured temperature or just the measured temperature itself. In addition, the embodiments provide methods and systems for estimating position correction without external tools and by using domain specific knowledge of the process. The embodiments described herein enable position correction using a trained machine learning (ML) recipe based on temperature domain knowledge. By using site (i.e., target location) information as an input to the DL Model, the trained DL recipe could provide site specific position correction. In addition, the DL model may estimate a position correction map at runtime to improve specimen placement accuracy. Any or all of the temperature domain knowledge described herein can be used to train the DL recipe.

The "predicted error in at least one of the one or more target locations" can be defined in one of two ways depending on which target location information is input to the DL model. If the target location information is the intended target location, the predicted error is defined as the difference between the intended target location and the predicted location at which output generation would be performed without any temperature-based correction. If the target location is the reported target location, the predicted error is defined as the difference between the reported target location and the actual specimen position at which the output is predicted to have been generated. The "predicted error" is also referred to herein as the "position error," and these terms are used interchangeably herein. Corrections made as described further herein based on the predicted error are referred to herein as "position correction" and result in corrected positions or "corrected target locations."

Obviously, since the DL model predicts error in at least one target location, the information for the at least one target location would be input to the DL model with the temperature information. The number of target locations for which the error is predicted may vary greatly from specimen to specimen and/or process to process. In general, the error may be predicted for a relatively sparse number of target locations across the specimen, e.g., 100 target locations versus several hundred or even a thousand target locations. The error predicted for any one target location can be used as described further herein to determine a corrected target location for that one target location as well as possibly other target locations in the vicinity of that one target location.

The target location information input to the DL model may therefore vary depending on the target locations themselves and sometimes whether the DL model is being trained or used at runtime. For example, in instances in which the error is to be predicted for target locations specified in a recipe for a process in which the target locations will be scanned, imaged, measured, etc., the target location information input to the DL model during training and runtime may be a subset of all of the target locations in the process recipe. Although the target location information that is input to the DL model during training and runtime may be the same for any one specimen and process, that is not necessary. For example, more target location information may be input for training purposes than at runtime. The opposite may also be the case, meaning that the target location information used for training purposes can be for fewer target locations than the number of target locations for which the error will be predicted at runtime. The target location information input for training may also be arbitrary in the sense that it may be for an arbitrarily selected set of specimen locations. Such target location information may be used for training in instances such as when the exact target locations are not known before the process is performed, which may the case for processes such as inspection in which a relatively large area on the specimen is scanned and then error is predicted in the reported scanned locations or only locations at which a defect is detected.

The target location information that is input to the DL model during training and runtime may be in any suitable file or format. For example, the target location information may be in coordinates defined relative to the specimen, the output acquisition subsystem, an alignment target on the specimen, an alignment target on an element of the output acquisition subsystem, a design or patterned features formed on the specimen, and the like. In general, it would be useful to train the DL model to predict error in the target location coordinates that will be used in the process performed on the specimen. As in any other target locating system or method, however, the coordinates for a target location in one space can be translated to the coordinates for the target location in another space in any suitable manner using any suitable coordinate translation relationship.

The inventors have numerically proven that position error recorded during moves along the X and Y axes of a stage has a correlation with change in temperature within the tool. Specifically, the inventors have established a correlation between various temperatures listed herein and error in the X and Y directions. For different sites on a specimen ("Site A" and "Site B"), the correlation between measured temperature and measured position error in X are shown in TABLE 1:

TABLE 1

| Temperature | Correlation with position error in X for Site A | Correlation with position error in X for Site B |
|---|---|---|
| Y_TEMP_FRONT | −0.41 | −0.43 |
| Y_TEMP_BACK | −0.39 | −0.42 |
| X_TEMP | −0.57 | −0.59 |
| CARRIAGE_TEMP | −0.72 | −0.73 |
| T_TEMP | −0.69 | −0.69 |
| Y_PLATE_TEMP | −0.75 | −0.76 |

For different sites on a specimen ("Site A" and "Site B"), the correlation between measured temperature and measured position error in Y are shown in TABLE 2:

TABLE 2

| Temperature | Correlation with position error in Y for Site A | Correlation with position error in Y for Site B |
|---|---|---|
| Y_TEMP_FRONT | 0.91 | 0.95 |
| Y_TEMP_BACK | 0.93 | 0.97 |
| X_TEMP | 0.86 | 0.90 |
| CARRIAGE_TEMP | 0.71 | 0.75 |
| T_TEMP | 0.77 | 0.81 |
| Y_PLATE_TEMP | 0.76 | 0.79 |

As can be seen from TABLES 1 and 2, the inventors have found that the correlation assumption holds across the sites and there exists within specimen variation in the correlation. Temperature to error correlation in the Y direction overall is higher than the X direction. There are two relatively highly correlated temperatures for the error in the X direction: carriage temperature and Y plate temperature. For the Y direction, all temperatures show a relatively strong relationship with the error.

In one embodiment, the DL model is configured for predicting the error in first and second of the one or more target locations based on the at least one of the one or more measured temperatures input to the DL model, and the computer subsystem is configured for determining first and second corrected target locations for the first and second of the one or more target locations, respectively, by applying the predicted error in the first and second of the one or more target locations to the first and second of the one or more target locations, respectively. For example, the error may be predicted in a few different ways and then used for determining corrected target locations. In one instance, an overall or global error may be predicted for more than one (or even all) of the target locations on the specimen, and then the same predicted error may be applied to each target location to determine a corrected target location for each target location. However, different errors may be predicted for different target locations or different subsets of the target locations, and then the corrected target location for any one target location may be determined using the error predicted for only that target location or only the subset of target locations in which it is included. How the error is predicted and used to determine corrected target locations may depend on the configuration of the temperature sensor(s) and how they measure temperature during a scan or process.

In some instances, different measured temperatures may be used for predicting different errors for different targets or different subsets of targets. For example, one of the temperature types may be useful for predicting errors in target locations on one portion of the specimen while another of the temperature types may be useful for predicting errors in target locations on another portion of the specimen. However, in other instances, the same temperature type may be used for predicting errors for multiple target locations or even all of the target locations, and some of those predicted errors may be determined using the same temperature type measured at different locations. The different locations may be defined with respect to the specimen, one or more hardware elements of the output acquisition subsystem, or some other reference coordinate system. For example, a temperature may be measured by a temperature sensor as a specimen is being scanned by the output acquisition subsystem, and the location information for the temperature measurements may be defined based on a position of the temperature sensor relative to the specimen at the time of the temperature measurement, position of the specimen in the output acquisition subsystem at the time of the temperature measurement, etc. In this manner, temperatures may be measured as a function of time and location and used for predicting errors in target locations. In such instances, the DL model may be trained as described further herein using location information as well as measurement information generated during a training scan.

To provide an accurate estimation of position error at a site level, position data needs to be fed to a DL estimator as well as correlated temperature data. In another embodiment, the computer subsystem is configured for acquiring location information for the one or more measured temperatures responsive to one or more locations at which the one or more measured temperatures were measured, and the location information for the at least one of the one or more measured temperatures is input with the at least one of the one or more measured temperatures to the DL model by the computer subsystem. The computer subsystem may acquire the location information in a few different ways. One is that a temperature sensor may generate location information if it moves in some manner, e.g., measures temperatures within the system as a function of position of the temperature sensor. In this manner, the computer subsystem may acquire the location information simply by receiving it from the temperature sensor(s). In other instances, a temperature sensor may have a fixed position with respect to the output acquisition hardware. Then, during a scan of a specimen, the temperature measurements generated by the temperature sensor may be recorded as a function of time, which may be used to correlate the temperature measurements with the position of the specimen with respect to the output acquisition subsystem hardware (or vice versa) and therefore the temperature sensor. The computer subsystem may input the location information with the measured temperature(s) into the DL model as described further herein. The DL model may be trained to use the location information with the measured temperature(s) as described further herein to predict error in the target locations.

In one such embodiment, the DL model is configured for predicting the error in first and second of the one or more target locations based on the at least one of the one or more measured temperatures and the location information input to the DL model, and the computer subsystem is configured for determining first and second corrected target locations for the first and second of the one or more target locations, respectively, by applying the predicted error in the first and second of the one or more target locations to the first and the second of the one or more target locations, respectively. The DL models described herein can have significant flexibility in predicting error from measured temperature(s) alone or with location information. For example, if the input to the DL model includes only temperature information, then the correction at the inference may not be site based. However, if the input to the DL model during training includes position data (e.g., in X and Y) as well as the temperature, then the DL model may provide site based corrections at the inference. The location information that is input to the DL model may vary greatly, but in general as long as reasonably sparse data like 100 temperatures measured at different locations is input, the location data does not need to be significantly dense (e.g., like a few thousands or even a few hundreds).

Machine learning (ML) can be generally defined as a type of artificial intelligence (AI) that provides computers with the ability to learn without being explicitly programmed. ML focuses on the development of computer programs that can teach themselves to grow and change when exposed to new data. In other words, ML can be defined as the subfield of computer science that "gives computers the ability to learn without being explicitly programmed." ML explores the study and construction of algorithms that can learn from and make predictions on data—such algorithms overcome following strictly static program instructions by making data driven predictions or decisions, through building a model from sample inputs.

The ML described herein may be further performed as described in "Introduction to Statistical Machine Learning," by Sugiyama, Morgan Kaufmann, 2016, 534 pages; "Discriminative, Generative, and Imitative Learning," Jebara, MIT Thesis, 2002, 212 pages; and "Principles of Data Mining (Adaptive Computation and Machine Learning)," Hand et al., MIT Press, 2001, 578 pages; which are incorporated by reference as if fully set forth herein. The embodiments described herein may be further configured as described in these references.

Generally speaking, "deep learning" (DL) (also known as deep structured learning, hierarchical learning or deep ML) is a branch of ML based on a set of algorithms that attempt to model high level abstractions in data. In a simple case, there may be two sets of neurons: ones that receive an input signal and ones that send an output signal. When the input layer receives an input, it passes on a modified version of the input to the next layer. In a DL-based model, there are usually many layers between the input and output (and the layers are not made of neurons but it can help to think of it that way), allowing the algorithm to use multiple processing layers, composed of multiple linear and non-linear transformations.

In one embodiment, the DL model includes a linear model. For example, the DL model may be a multi-output linear regressor. A linear relationship between temperature and positioning error may be described by the following function:

$$\delta x = c_0 + c_1 x + c_2 y + \sum_{i=3}^{n} c_i \Delta T_i$$

where $\delta x$ is the estimated position error in the x direction, $\Delta T_i$ is the change in the $i^{th}$ temperature relative to some baseline steady-state value (recorded during calibration), x is the position of the stage in the X direction, y is the position of the stage in the Y direction, and the coefficients, $C_i$, are the coefficients that are fitted to calibration data.

In another embodiment, the DL model includes a neural network. The neural network may be configured as a generative model. A "generative" model can be generally defined as a model that is probabilistic in nature. In other words, a "generative" model is not one that performs forward simulation or rule-based approaches and, as such, a model of the physics of the processes involved is not necessary. Instead, as described further herein, the generative model can be learned (in that its parameters can be learned) based on a suitable training set of data.

In one embodiment, the neural network is configured as a deep generative model. For example, the model may be configured to have a DL architecture in that the model may include multiple layers, which perform a number of algorithms or transformations. In a further embodiment, the neural network may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In a further embodiment, the DL model includes a convolutional neural network (CNN). The CNN may include any suitable types of layers such as convolution, pooling, fully connected, soft max, etc., layers having any suitable configuration known in the art. The CNN may be trained as described herein or in any other suitable manner known in the art. The DL model may have any suitable CNN configuration or architecture known in the art.

In another embodiment, the computer subsystem is configured for training the DL model with a training set including training inputs and training outputs. The training inputs include the one or more temperatures measured by the one or more temperature sensors during a training scan, and the training outputs include measured errors in at least a portion of the one or more target locations during the training scan. For example, the computer subsystem may build a DL model recipe to estimate position error as described herein.

Figure 4:
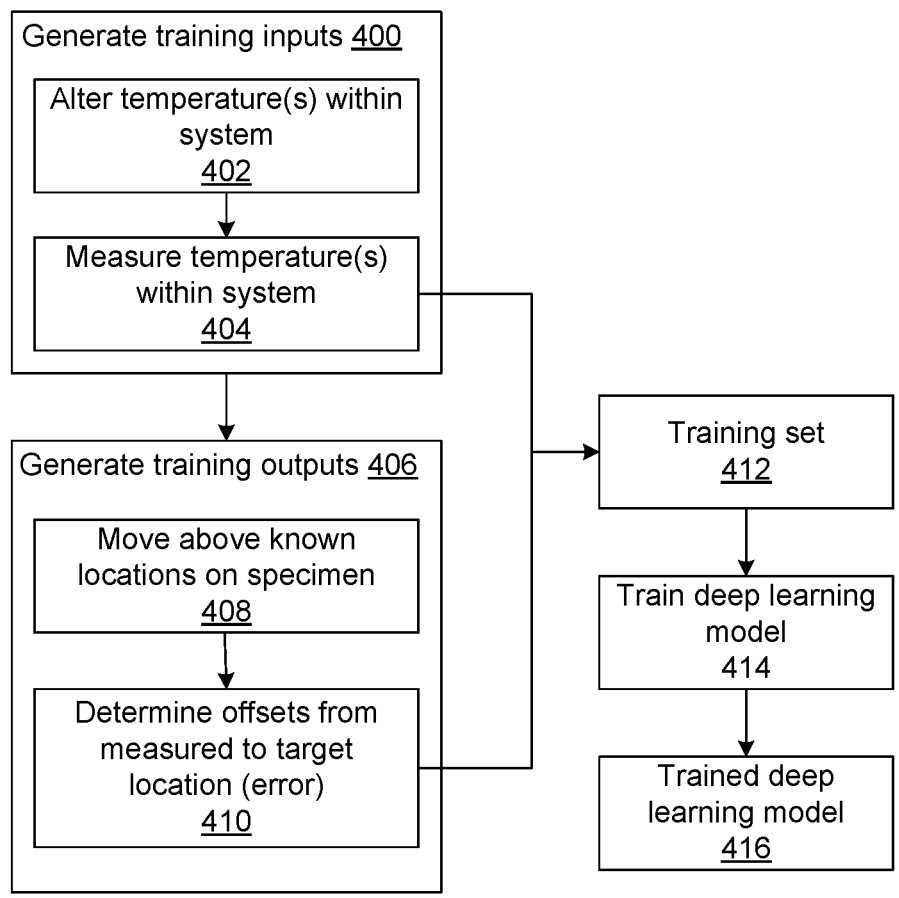
FIG. 4-5 are flow charts illustrating steps that may be performed by the embodiments described herein during training and runtime, respectively.

FIG. 4 illustrates one flow diagram for training a DL model. These steps may be performed during a setup phase and/or a calibration phase. As shown in FIG. 4, the computer subsystem may generate training inputs in step 400. Generating the training inputs may include two steps, the first one of which is altering temperature(s) within the system, as shown in step 402. This step may include, for example, heating and/or cooling a robot that is at least partially responsible for changing and controlling a position of the specimen within the tool. Altering the temperature(s) within the system may be performed in any suitable manner known in the art. Generating the training inputs may also include measuring temperature(s) within the system, as shown in step 404. For example, as the robot is heated and/or cooled to intentionally change the temperature in the system, the temperatures may be continually measured, which may include any one or more of the temperatures described herein. In this manner, the computer subsystem may acquire temperature information from the temperature sensor(s) and measure various temperature data in the tool at different time frames. Ideally, at this stage, the temperatures which are measured and recorded may include those that are measured by all of the temperature sensors included in the system.

In some embodiments, the training inputs include location information for the one or more temperatures measured during the training scan responsive to one or more locations at which the one or more temperatures were measured during the training scan. For example, measuring the temperature(s) within the system, as shown in step 404, may include measuring the temperature(s) as a function of position within the system or as a function of position with respect to the specimen. Therefore, the results of measuring the temperature(s) within the system during the training scan may include the measured temperatures as well as the location information associated with the measured temperature(s) and any other data generated during the temperature measurements. In this manner, generating the training inputs may include generating any and all of the information associated with the temperature measurements, including the measured temperatures themselves and other data such as location, time, etc. data or information. The training inputs may therefore include position data in X and Y as well as the measured temperatures. Any and all of this information may be included in the training inputs that are added to the training set used to train the DL model.

As shown in step 406, the computer subsystem may generate training outputs. This step may also include multiple steps including moving above known locations on a specimen, as shown in step 408, and determining offsets from measured to target location (error), as shown in step 410. These steps are intended to measure robot movement error by moving above known locations on a specimen (sites) and finding the offset from measured to target location (or the error in the position). This step may also include collecting stage specimen map data at different time frames. For example, the error may be measured using repeated stagemaps, which may be performed using a stagemapping application described further herein. Any difference between successive stagemaps while the tool is changing temperature may then be attributed to the thermal differences and is an indication of the thermal error in the target location positioning. The location information used for training may be input to the DL model as described above and may include any of the location information described above.

Generating the training inputs and training outputs may be repeated n times depending on how much data is expected to be needed for training the DL model. The amount of data needed for training may vary from tool-to-tool and from DL model architecture-to-DL model architecture. For example, if the DL model is using the linear relationship described above, in the simplest case, training may include finding coefficients, $C_i$, that minimize the sum of the squared error when predicting $6x$ from calibration data. To do this least squares fitting, at least n calibration data points may be needed to fit. Generally speaking, DL model training can be performed at least initially with as much training data as can be reasonably or practically collected with existing temperature sensors or an initial temperature sensor configuration. The testing and validation phases of training will provide an indication of if that amount of training data is sufficient. If it is not, then additional training data can be collected as described above, and the additional training data can be used for re-training or added to the initial training data and then used for re-training.

The result of generating the training inputs and training outputs is training set 412, which may then be used in step 414 to train the DL model. The training may be performed in this step as described further herein, but generally includes training the DL model to estimate position error from inputs that include intended target location and temperature. In addition, the training may include training the DL model to output position correction at the site level. Depending on how well the trained DL model performs in testing and validation or use, the computer subsystem may measure position correction map at unseen time frame to improve specimen placement accuracy using the errors predicted by the DL model. This step may be performed before the trained DL model is released for use and/or after the DL model has been in use for some period of time for monitoring and/or recalibration purposes. The training step may produce trained DL model 416, which may be used as described further herein.

In one embodiment, the at least one of the one or more measured temperatures input to the DL model by the computer subsystem includes all of the one or more temperatures measured by all of the one or more temperature sensors during a process performed with the output acquisition subsystem for the specimen. For example, to show the effect of temperature data on the accuracy of position correction $D_x$, $D_y$, two different ML models were tested: Model A, a function of all temperatures and position X and Y, and Model B, a function of only two highly correlated temperatures and position X and Y.

Model A: $(D_x, D_y) = f\begin{pmatrix} X, Y, Y_{TEMP_{FRONT}}, Y_{TEMP_{BACK}}, X_{TEMP}, \\ CARRIAGE_{TEMP}, T\_TEMP, Y\_PLATE\_TEMP \end{pmatrix}$ Model B: $(D_x, D_y) = f(X, Y, CARRIAGE\_TEMP, Y\_PLATE\_TEMP)$ Error maps (contour plots for error in X and Y) of position correction of the two different models were generated, but are not included herein only because of reproduction and clarity concerns. The error maps show that the accuracy of estimating position correction on unseen time period frame data (i.e., blind test data that are not used for DL model training but are used to demonstrate the trained model is indeed meeting performance standards with new data) is degraded compared to the one using all of the temperature information.

Training the DL model with all of the temperatures measured by all of the temperature sensors may be advantageous for a few reasons. One is that the mechanisms by which temperature affects position accuracy is not necessarily well understood for the tools described herein. That is also one of the reasons that a DL model is such an advantageous way to predict position error caused by temperature. More specifically, a DL model such as those described herein can learn the relationships between temperature and position error that are not currently understood. In other words, the DL model does not need a model grounded in physics and/or thermodynamics to learn how to predict target location error from temperature measurements.

In addition, if all of the available temperature measurements from all of the available temperature sensors are used for training, the DL model can learn which of the temperature measurements from which of the sensors are useful for predicting target location error. In this manner, a user does not need to establish which temperatures are useful or not, and as long as the data collection from the temperature sensors does not inhibit tool performance, it should not matter if temperature measurements that are not useful are input to the DL model. Therefore, by utilizing existing temperature sensors and/or by adding some additional temperature sensors with some judicious placement of them (e.g., near or within hardware elements responsible for controlling specimen position rather than everywhere possible within the tool), the DL model itself can learn which of the temperature measurements are useful and which are not.

The parameters of the trained DL model may indicate which temperature measurements are useful and which are not if there is a concern about temperature measurement data collection. For example, by examining the weights in the DL model assigned to the various inputs corresponding to the various temperature sensors, a user can identify any temperature measurements that are not used or are minimally useful for predicting target location error and then optionally choose to eliminate them from the DL model input. The embodiments described herein therefore advantageously eliminate any need for the user to individually establish the many possible pathways from change in temperature to specimen positioning error. Instead, all of the temperatures that may have an effect on positioning error can be measured in aggregate and compensated for all at once.

Despite the fact that the DL model eliminates the need for a science-based model to predict positioning error from temperature measurements, the following examples of ways that changes in temperature can affect positioning error have been established by the inventors for some of the commercially available tools used for their experiments and are included here to facilitate an understanding of how the temperature can affect positioning accuracy and why the embodiments described herein are important for tools such as those described herein. Two of the most significant of the identified connections between changes in temperature of components of a microscope and positioning accuracy of the microscope appear to be: 1) deflection of the Y plate (part of the specimen positioning robot) relative to the Y-encoder, and 2) displacement of the supporting structure of the optics relative to the specimen handling stage. In the first example, the Y plate (a component that supports the motion of the specimen aligned with the Y axis of the tool) expands as it heats up but is constrained at several locations where it is fixed to other components. Because the Y plate is restricted from expanding, it can bow away from its center and becomes misaligned with the encoder (the component used to measure the position of a motor along this axis). In the second example, the supporting structure of the camera that measures the location on the specimen can shift/deform slightly as it changes temperature. The positioning of the specimen using the camera is measured (e.g., by imaging a defined reference mark on a specimen and using image processing to calculate where that mark is relative to where it should be) so any relative shift between the camera and the specimen handling stage translates into positioning error.

The inventors have also discovered that the quality of training data can affect the DL model performance. For example, the DL model can be affected by the different approaches used to collect stage map data or different tools (i.e., a data quality issue). By improving the data quality, extremely large errors in the DL error predictions that may occur for example at sites located proximate the edges of the specimen may be brought into a specified target range for the predicted error. Therefore, in some instances, the training of the DL model may include an initial training with suitable training data, testing of the initially trained DL model, and determining if the error range on a specimen map is all within specification or all sites on a specimen are within specification. If the error range is out of specification, additional training data may be generated, which may include training data for the whole specimen or only training data for portions of the specimen where the out of specification error range is found. The additional training data may then be used for re-training the DL model, which may again be tested to see if the predicted error ranges are all within specification. In this manner, the training of the DL model may include one or more cycles of training, testing, and validation, with each cycle performed with different or supplemented training data.

The DL model may or may not be trained by the computer subsystem and/or one of the component(s) executed by the computer subsystem. For example, another method or system may train the DL model, which then may be stored for use as one of the component(s) executed by the computer subsystem. In this manner, the DL model may be trained on-tool or off-tool. In either case, the training may include inputting the training inputs into the DL model and altering one or more parameters of the DL model until the output produced by the DL model matches (or substantially matches) the training outputs. Training may include altering any one or more trainable parameters of the DL model. The one or more parameters of the DL model that are trained may include one or more weights for any layer of the DL model that has trainable weights. In one such example, the weights may include weights for convolution layers but not pooling layers.

Figure 5:
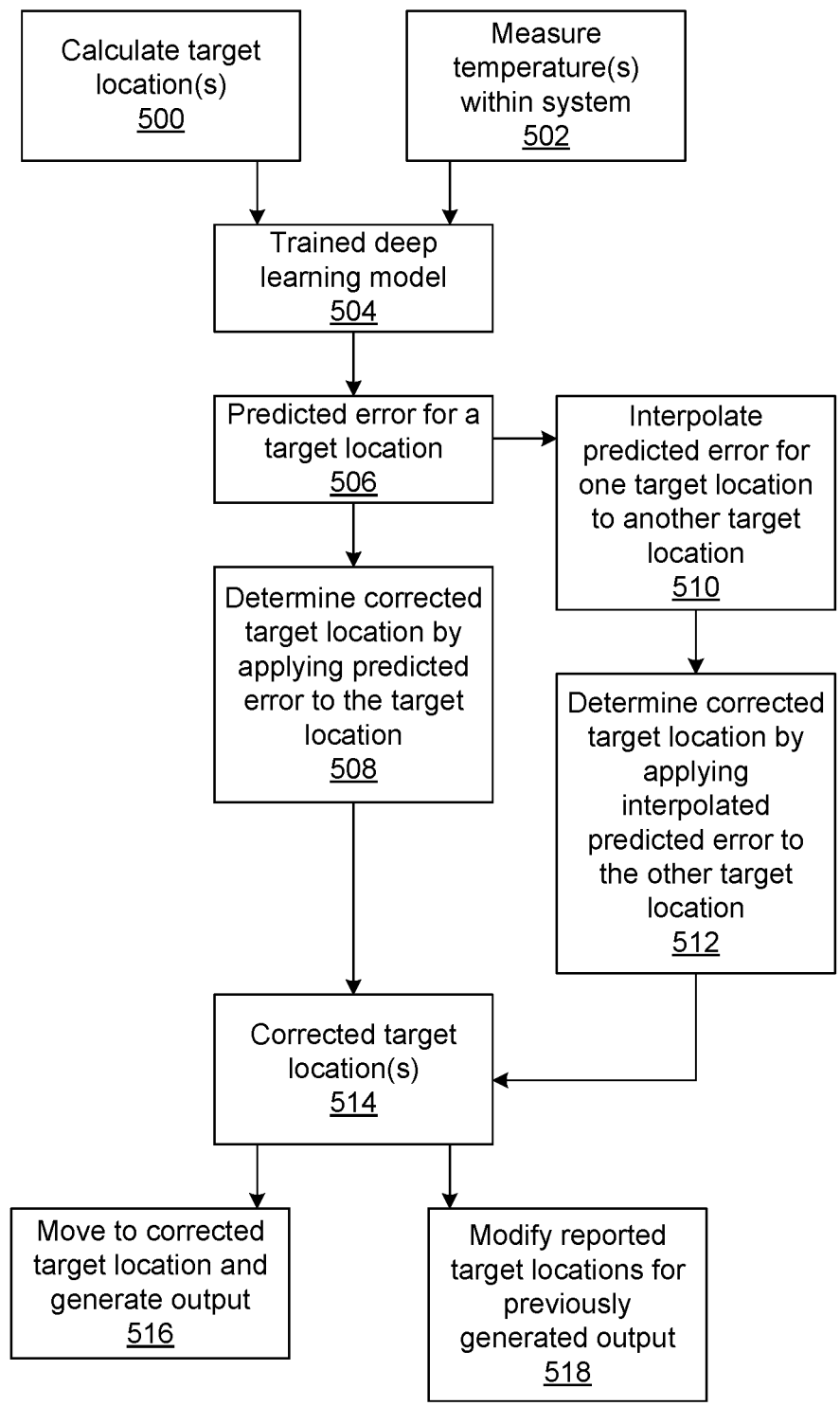

FIG. 5 illustrates steps that may be performed during runtime by the embodiments described herein. The temperature measurements, error predictions, and corrected target location determinations may all be performed on-tool to monitor offset change and specimen placement improvement. As shown in FIG. 5, the computer subsystem may calculate target location(s), as shown in step 500. The target locations may or may not need to be calculated in this step depending on how they are input to the computer subsystem. For example, in some instances, the computer subsystem actually calculates target locations at runtime. In such instances, the recipe for the process contains target locations expressed in specimen coordinates, and the computer subsystem translates this into specimen handling coordinates. This step may include, for example, a 30 degree rotation in axes and one or more of the other alignment techniques described further herein.

The temperature sensor(s) measure temperature(s) within the system, as shown in step 502. The temperature sensor(s) may measure the temperatures during runtime as described further herein. The calculated target location(s) and the measured temperature(s) are input to trained DL model 504, which outputs predicted error for a target location, as shown in step 506. In this manner, the trained DL model may be applied to estimate error expected when moving to nearby sites.

The computer subsystem is configured for determining a corrected target location for the at least one of the one or more target locations by applying the predicted error to the at least one of the one or more target locations. For example, as shown in step 508 of FIG. 5, the computer subsystem may determine a corrected target location by applying predicted error from step 506 to the target location calculated in step 500. Applying the predicted error to the at least one target location may include, for example, subtracting the predicted error from the target location but can include a more sophisticated function if a simple subtraction does not yield results that are sufficiently accurate. The determining the corrected target location step may be performed by the computer subsystem using an algorithm, which may be part of the one or more components executed by the computer subsystem or may be separate from those components.

In some embodiments, the computer subsystem is configured for determining a corrected target location for a second of the one or more target locations by interpolating the predicted error determined for the at least one of the one or more target locations to the second of the one or more target locations and applying the interpolated predicted error to the second of the one or more target locations. For example, as shown in step 510, the computer subsystem may interpolate predicted error for one target location to another target location. The computer subsystem may also determine a corrected target location by applying the interpolated predicted error to the other target location, as shown in step 512. In this manner, the computer subsystem may be configured to interpolate the error estimate from nearby site(s) to a target location. Interpolating the predicted error from one site to another may be performed in any suitable manner known in the art. Determining a corrected target location from the interpolated predicted error may be performed in the same manner as described herein for the predicted error.

The corrected target locations determined with or without interpolation may be combined into one set of corrected target location(s), as shown in step 514, and then used for position correction in one or more of the various ways described herein.

In one embodiment, the computer subsystem is configured for determining the corrected target location before the output acquisition subsystem generates the output at the at least one of the one or more target locations. For example, as shown in step 516 of FIG. 5, the system may move to a corrected target location and generate output. In this manner, the system may move to the corrected target location, e.g., target location—predicted error (or interpolated predicted error), and then the output acquisition subsystem may image, scan, measure, etc. at the corrected target location. This sequence of steps may be most useful for move-acquire-measure type systems in which the measurements are intended to be performed at specific, discrete locations on the specimen and the measurements do not involve scanning a relatively large area on the specimen.

In one such example, suppose that a process involves measuring the space between two specific features in a die formed on a wafer and then measuring dimensions of other features spaced from those two specific features. In this instance, the scanning subsystem would ideally drive to the location of the space between the two specific features, the output acquisition subsystem would generate output at that location, and then the scanning subsystem would move the specimen so that the next feature or features to be measured are positioned in the field of view of the output acquisition subsystem. If that target location is not corrected for temperature before the measurement is performed for the space between the two features, the measurement could be performed at a different location. The results of the process would then be missing that measurement or would include a measurement for a different location that could be erroneously interpreted as a measurement of the space between the two features. The results of the process would then be incomplete or erroneous, which is disadvantageous for a number of obvious reasons. Correcting the target location for positioning errors caused by temperature variations as described herein can therefore be advantageously used to prevent issues like incomplete or erroneous specimen measurements and other quality control related process results.

In another embodiment, the computer subsystem is configured for determining the corrected target location after the output acquisition subsystem generates the output at the at least one of the one or more target locations. For example, as shown in step 518 of FIG. 5, the computer subsystem may modify reported target locations for previously generated output. In this manner, the output acquisition subsystem may generate output for target location 1 on the specimen, the DL model may predict error for that target location from one or more input temperature measurements (or the error may be determined, e.g., interpolated, from the predicted error for a nearby target location), and then the target location 1 coordinates may be corrected using the predicted error.

Generating output for a specimen with an output acquisition subsystem and then correcting the coordinates of the target locations at which the output was generated may be more suitable for applications like inspection in which a relatively large area on the specimen is scanned. For example, during inspection, the coordinates of any defects detected during the process may be recorded, the DL model may predict errors in the recorded defect locations based on the temperatures measured at or near where the defects were detected, and the reported defect coordinates may be corrected using the predicted errors. Such a position correction may be less useful in applications in which it is important to generate output at a specific, discrete location on the specimen because it would be more advantageous to correct the target location prior to output generation to make sure that the specific location is imaged, measured, inspected, defect reviewed, etc.

In one embodiment, the DL model is configured for predicting error in one or more additional target locations on the specimen or an additional specimen at which additional output is generated by an additional output acquisition subsystem of an additional system based on one or more additional temperatures measured by one or more additional temperature sensors of the additional system input to the DL model by the computer subsystem. For example, if a DL model is trained for multiple tools, the DL model can be used for estimating specimen level position error and correction per each tool. In this case, each of the output acquisition subsystems and other components of the systems such as temperature sensors may be configured as described herein. Each of the systems may have the same or at least similar configurations. For example, each of the systems may be configured as shown in FIG. 3. Training the DL model for multiple tools may otherwise be performed as described herein.

In a further embodiment, the training inputs include one or more additional temperatures measured by one or more additional temperature sensors included in an additional system during an additional training scan of the specimen or an additional specimen performed with the additional system, and the training outputs include additional measured errors in one or more additional target locations on the specimen or the additional specimen at which output is generated by an additional output acquisition subsystem of the additional system during the additional training scan. For example, in a more general case, the DL model can be trained on stage map and temperature data from multiple tools simultaneously. Training the DL model for multiple tools may include preparing specimen stage map data from multiple tools and training a DL model across tools. In this manner, if training data is generated with multiple tools to train the model (a single model), the same model can be used to estimate position error across the tools.

In some embodiments, the computer subsystem is configured for monitoring drift in the system and the additional system relative to each other based on the predicted error and the additional predicted error. In this manner, the embodiments described herein may be configured for estimating tool drift in the position error based on the error predicted by the DL model from the input measured temperature(s). For example, if the DL model is trained on stage map and temperature data from multiple tools simultaneously, users could estimate how much the specific tool is drifting by estimating the amount of position correction per each tool.

In another embodiment, the computer subsystem is configured for calibrating the system and the additional system to each other based on the predicted error and the additional predicted error. In this manner, the embodiments described herein may be configured for performing a tool-to-tool calibration. For example, if the DL model is trained on stage map and temperature data from multiple tools simultaneously, users could estimate tool-to-tool calibration by estimating the amount of position correction per each tool.

The computer subsystem may also be configured for generating results that include the determined information, which may include any of the results or information described herein. The results of determining the information may be generated by the computer subsystem in any suitable manner. All of the embodiments described herein may be configured for storing results of one or more steps of the embodiments in a computer-readable storage medium. The results may include any of the results described herein and may be stored in any manner known in the art. The results that include the determined information may have any suitable form or format such as a standard file type. The storage medium may include any storage medium described herein or any other suitable storage medium known in the art.

After the results have been stored, the results can be accessed in the storage medium and used by any of the method or system embodiments described herein, formatted for display to a user, used by another software module, method, or system, etc. to perform one or more functions for the specimen or another specimen of the same type. For example, the measured temperatures, predicted errors, and corrected target locations may be stored and used as described herein or in any other suitable manner. In addition, depending on the process that is performed on the specimen by the system, the results may include any information for the specimen determined from the output generated for the specimen by the output acquisition subsystem. Such results produced by the computer subsystem may include information for any defects detected on the specimen such as location, etc., of the bounding boxes of the detected defects, detection scores, information about defect classifications such as class labels or IDs, any defect attributes determined from any of the images, etc., specimen structure measurements, dimensions, shapes, etc. or any such suitable information known in the art. That information may be used by the computer subsystem or another system or method for performing additional functions for the specimen and/or the detected defects such as sampling the defects for defect review or other analysis, determining a root cause of the defects, etc.

Such functions also include, but are not limited to, altering a process such as a fabrication process or step that was or will be performed on the specimen in a feedback or feedforward manner, etc. For example, the computer subsystem may be configured to determine one or more changes to a process that was performed on the specimen and/or a process that will be performed on the specimen based on the determined information. The changes to the process may include any suitable changes to one or more parameters of the process. In one such example, the computer subsystem preferably determines those changes such that the defects can be reduced or prevented on other specimens on which the revised process is performed, the defects can be corrected or eliminated on the specimen in another process performed on the specimen, the defects can be compensated for in another process performed on the specimen, etc. The computer subsystem may determine such changes in any suitable manner known in the art.

Those changes can then be sent to a semiconductor fabrication system (not shown) or a storage medium (not shown) accessible to both the computer subsystem and the semiconductor fabrication system. The semiconductor fabrication system may or may not be part of the system embodiments described herein. For example, the output acquisition subsystem and/or the computer subsystem described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

The embodiments described herein have a number of advantages in addition to those already described. For example, the embodiments described herein do not need external metrology tools to correct specimen position. In particular, once the DL model is trained, the only data needed for position correction is the information for the specimen and the measured temperature information. No other external tool or method is needed to predict position error which is a significant benefit of the DL models described herein. In addition, once the DL model is trained, inference on different time frames is essentially instant. Furthermore, the DL model and embodiments described herein can be generalized across multiple tools.

Although the embodiments described herein do not need external metrology tools for specimen position correction, the embodiments described herein may be used in combination with any other position control/correction methods or subsystems available on the tool. One such method may be a stagemapping application. In stagemapping, during tool calibration, the position error when moving in an open loop to several locations across a specimen may be recorded (this map of position to error is called a "stagemap") and then these (unchanging) error measurements may be compensated for during runtime. Another such method is an alignment technique in which every time a specimen is loaded into the tool, the scanning subsystem navigates to a couple of reference marks near the center and across the Y axis of the specimen to measure the precise angle of the specimen relative to the chuck and then take that angle into account when moving across the specimen. An additional such method is a navigation correction technique in which the positions of a couple of reference marks around the edge of the specimen are recorded and used to calculate an Euclidean transform (e.g., translation, stretch, rotation, skew), which is then used in later moves.

Each of the embodiments of each of the systems described above may be combined together into one single embodiment.

Another embodiment relates to a method for determining information for a specimen. The method includes measuring one or more temperatures within a system with one or more temperature sensors. The system includes an output acquisition subsystem configured for generating output for a specimen at one or more target locations on the specimen. The method also includes predicting error in at least one of the one or more target locations by inputting at least one of the one or more measured temperatures into a DL model included in one or more components executed by a computer system. In addition, the method includes determining a corrected target location for the at least one of the one or more target locations by applying the predicted error to the at least one of the one or more target locations. The inputting and determining are performed by the computer system.

Each of the steps of the method may be performed as described further herein. The method may also include any other step(s) that can be performed by the system, temperature sensor(s), output acquisition subsystem, DL model, and computer system described herein. The system, temperature sensor(s), output acquisition subsystem, DL model, and computer system may be configured according to any of the embodiments described herein. The method may be performed by any of the system embodiments described herein.

Figure 6:
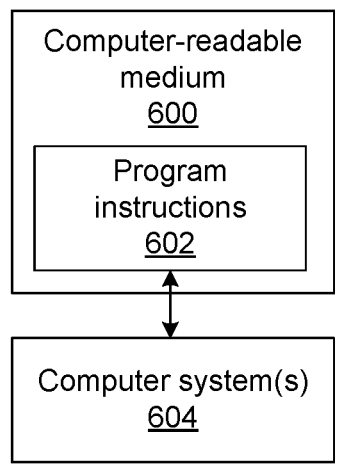
FIG. 6 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for determining information for a specimen. One such embodiment is shown in FIG. 6. In particular, as shown in FIG. 6, non-transitory computer-readable medium 600 includes program instructions 602 executable on computer system(s) 604. The computer-implemented method includes acquiring one or more temperatures measured within a system with one or more temperature sensors. The system is configured as described further herein. The computer-implemented method also includes the predicting and determining steps described above. The computer-implemented method may further include any step(s) of any method(s) described herein.

Program instructions 602 implementing methods such as those described herein may be stored on computer-readable medium 600. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system(s) 604 may be configured according to any of the embodiments described herein.

Further modifications and alternative embodiments of various aspects of the invention will be apparent to those skilled in the art in view of this description. For example, methods and systems for determining information for a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine information for a specimen, comprising:
   an output acquisition subsystem configured to generate output for a specimen at one or more target locations on the specimen;
   one or more temperature sensors configured to measure one or more temperatures within the output acquisition subsystem;
   a computer subsystem configured to acquire the one or more measured temperatures from the one or more temperature sensors; and
   one or more components executed by the computer subsystem;
      wherein the one or more components comprise a deep learning model configured for predicting error in at least one of the one or more target locations based on at least one of the one or more measured temperatures input to the deep learning model by the computer subsystem, wherein the predicted error is defined as (1) a difference between an intended target location and a predicted location at which output generation is performed without any temperature-based correction or (2) a difference between a reported target location and an actual specimen position at which the output is predicted to have been generated; and wherein the computer subsystem is further configured for determining a corrected target location for the at least one of the one or more target locations by applying the predicted error to the at least one of the one or more target locations.

2. The system of claim 1, wherein the one or more temperature sensors are further configured to measure the one or more temperatures during a process performed with the output acquisition subsystem for the specimen.

3. The system of claim 1, wherein the one or more temperature sensors are further configured to measure the one or more temperatures at or within one or more hardware elements of the system configured to alter a position of the specimen within the system.

4. The system of claim 1, wherein the at least one of the one or more measured temperatures input to the deep learning model by the computer subsystem comprises all of the one or more temperatures measured by all of the one or more temperature sensors during a process performed with the output acquisition subsystem for the specimen.

5. The system of claim 1, wherein the computer subsystem is further configured for determining the corrected target location before the output acquisition subsystem generates the output at the at least one of the one or more target locations.

6. The system of claim 1, wherein the computer subsystem is further configured for determining the corrected target location after the output acquisition subsystem generates the output at the at least one of the one or more target locations.

7. The system of claim 1, wherein the deep learning model is further configured for predicting the error in first and second of the one or more target locations based on the at least one of the one or more measured temperatures input to the deep learning model, and wherein the computer subsystem is further configured for determining first and second corrected target locations for the first and second of the one or more target locations, respectively, by applying the predicted error in the first and second of the one or more target locations to the first and the second of the one or more target locations, respectively.

8. The system of claim 1, wherein the computer subsystem is further configured for acquiring location information for the one or more measured temperatures responsive to one or more locations at which the one or more measured temperatures were measured, and wherein the location information for the at least one of the one or more measured temperatures is input with the at least one of the one or more measured temperatures to the deep learning model by the computer subsystem.

9. The system of claim 8, wherein the deep learning model is further configured for predicting the error in first and second of the one or more target locations based on the at least one of the one or more measured temperatures and the location information input to the deep learning model, and wherein the computer subsystem is further configured for determining first and second corrected target locations for the first and second of the one or more target locations, respectively, by applying the predicted error in the first and second of the one or more target locations to the first and the second of the one or more target locations, respectively.

10. The system of claim 1, wherein the computer subsystem is further configured for determining a corrected target location for a second of the one or more target locations by interpolating the predicted error determined for the at least one of the one or more target locations to the second of the one or more target locations and applying the interpolated predicted error to the second of the one or more target locations.

11. The system of claim 1, wherein the computer subsystem is further configured for training the deep learning model with a training set comprising training inputs and training outputs, wherein the training inputs comprise the one or more temperatures measured by the one or more temperature sensors during a training scan, and wherein the training outputs comprise measured errors in at least a portion of the one or more target locations during the training scan.

12. The system of claim 11, wherein the training inputs further comprise location information for the one or more temperatures measured during the training scan responsive to one or more locations at which the one or more temperatures were measured during the training scan.

13. The system of claim 11, wherein the training inputs further comprise one or more additional temperatures measured by one or more additional temperature sensors included in an additional system during an additional training scan of the specimen or an additional specimen performed with the additional system, and wherein the training outputs further comprise additional measured errors in one or more additional target locations on the specimen or the additional specimen at which output is generated by an additional output acquisition subsystem of the additional system during the additional training scan.

14. The system of claim 1, wherein the deep learning model is further configured for predicting additional error in one or more additional target locations on the specimen or an additional specimen at which additional output is generated by an additional output acquisition subsystem of an additional system based on one or more additional temperatures measured by one or more additional temperature sensors of the additional system input to the deep learning model by the computer subsystem, and wherein the computer subsystem is further configured for monitoring drift in the system and the additional system relative to each other based on the predicted error and the additional predicted error.

15. The system of claim 1, wherein the deep learning model is further configured for predicting additional error in one or more additional target locations on the specimen or an additional specimen at which additional output is generated by an additional output acquisition subsystem of an additional system based on one or more additional temperatures measured by one or more additional temperature sensors of the additional system input to the deep learning model by the computer subsystem, and wherein the computer subsystem is further configured for calibrating the system and the additional system to each other based on the predicted error and the additional predicted error.

16. The system of claim 1, wherein the deep learning model comprises a linear model.

17. The system of claim 1, wherein the deep learning model comprises a neural network.

18. The system of claim 1, wherein the deep learning model comprises a convolutional neural network.

19. The system of claim 1, wherein the output acquisition subsystem is further configured as a metrology subsystem.

20. The system of claim 1, wherein the output acquisition subsystem is further configured as an inspection subsystem.

21. The system of claim 1, wherein the output acquisition subsystem is a light-based subsystem.

22. The system of claim 1, wherein the output acquisition subsystem is an electron-based subsystem.

23. A non-transitory computer-readable medium, storing program instructions executable on a computer system for performing a computer-implemented method for determining information for a specimen, wherein the computer-implemented method comprises:

acquiring one or more temperatures measured within an output acquisition subsystem with one or more temperature sensors, wherein the output acquisition subsystem is configured for generating output for a specimen at one or more target locations on the specimen;

predicting error in at least one of the one or more target locations by inputting at least one of the one or more measured temperatures into a deep learning model included in one or more components executed by the computer system, wherein the predicted error is defined as (1) a difference between an intended target location and a predicted location at which output generation is performed without any temperature-based correction or (2) a difference between a reported target location and an actual specimen position at which the output is predicted to have been generated; and determining a corrected target location for the at least one of the one or more target locations by applying the predicted error to the at least one of the one or more target locations.

24. A method for determining information for a specimen, comprising:

measuring one or more temperatures within an output acquisition subsystem with one or more temperature sensors, wherein the output acquisition subsystem is configured for generating output for a specimen at one or more target locations on the specimen;

predicting error in at least one of the one or more target locations by inputting at least one of the one or more measured temperatures into a deep learning model included in one or more components executed by a computer system, wherein the predicted error is defined as (1) a difference between an intended target location and a predicted location at which output generation is performed without any temperature-based correction or (2) a difference between a reported target location and an actual specimen position at which the output is predicted to have been generated; and determining a corrected target location for the at least one of the one or more target locations by applying the predicted error to the at least one of the one or more target locations, wherein said inputting and said determining are performed by the computer system.

* * * * *